US005903513A

United States Patent [19]

Itou

[11] Patent Number: 5,903,513

[45] Date of Patent: May 11, 1999

[54] SEMICONDUCTOR INTEGRATED CIRCUIT DEVICE WITH CLOCK FREQUENCY INVARIANT VOLTAGE STEP-DOWN CIRCUIT

[75] Inventor: Takashi Itou, Tokyo, Japan

[73] Assignee: Mitsubishi Denki Kabushiki Kaisha, Tokyo, Japan

[21] Appl. No.: 08/939,687

[22] Filed: Sep. 29, 1997

[30] Foreign Application Priority Data

Mar. 26, 1997 [JP] Japan ................................ P9-073198

[51] Int. Cl.[6] ........................................................ G11C 8/00

[52] U.S. Cl. .................... 365/233; 365/230.08; 365/207; 365/189.11

[58] Field of Search .............................. 365/222, 189.11, 365/226, 233, 230.08, 230.03, 194, 191, 185.21, 207, 196

[56] References Cited

U.S. PATENT DOCUMENTS 5,337,282 8/1994 Hoike ...................................... 365/222
5,499,213 3/1996 Niimi et al. ............................ 365/222
5,594,699 1/1997 Normura et al. ....................... 365/226

FOREIGN PATENT DOCUMENTS 58-171842 10/1983 Japan .
4-112312 4/1992 Japan .

*Primary Examiner*—David Nelms
*Assistant Examiner*—Thong Le
*Attorney, Agent, or Firm*—McDermott, Will & Emery

[57] ABSTRACT

A semiconductor integrated circuit device comprising an internal power supply circuit for supplying to the internal circuits of the semiconductor integrated circuit device a stable output voltage that does not vary with the clock frequency is disclosed. An internal voltage step-down means steps down an external power supply voltage to generate an internal power supply voltage based on a particular reference voltage. An internal clock signal generator generates an internal clock signal based on a clock signal supplied from an external source. A frequency discriminator then determines the frequency of the internal clock signal generated by the internal clock signal generator. With the internal clock signal frequency thus determined, the internal voltage step-down means is able to accelerate the rate of increase in the output current in response to the drop in the internal power supply voltage as the frequency identified by the frequency discriminator rises.

14 Claims, 15 Drawing Sheets

SEMICONDUCTOR INTEGRATED CIRCUIT DEVICE WITH CLOCK FREQUENCY INVARIANT VOLTAGE STEP-DOWN CIRCUIT

BACKGROUND OF THE INVENTION

1. Field of the Invention

The present invention relates to a semiconductor integrated circuit device, and relates particularly to a semiconductor integrated circuit device comprising an internal power supply circuit for converting a power supply voltage from an external source to a particular voltage and supplying the converted voltage to the internal circuits of the semiconductor integrated circuit device.

2. Description of the Prior Art

FIG. 16 is a block diagram of a 64 Mbit×8 synchronous DRAM device according to the prior art.

As shown in FIG. 16, the synchronous DRAM (SDRAM below) 200 device comprises an internal power supply circuit 205, address buffer 206, control signal buffer 207, clock buffer 208, four memory array banks 209, 210, 211, and 212, input/output (I/O) buffer 213 for data input and output, and a control circuit 215 comprising mode register 214 and controlling the memory array banks 209–212 and I/O buffer 213. The internal power supply circuit 205 comprises an internal voltage step-down circuit 201, substrate voltage generator 202, step-up voltage generator 203, and reference voltage generator 204.

The internal voltage step-down circuit 201 drops the power supply voltage from an external source to power supply terminal Vcc to produce the internal power supply voltage int.Vcc supplied to the internal circuits of the SDRAM 200. The value of internal power supply voltage int.Vcc is determined according to the reference voltage Vref input from the reference voltage generator 204. More specifically, the internal voltage step-down circuit 201 controls and outputs the internal power supply voltage int.Vcc at the level of the reference voltage Vref supplied from the reference voltage generator 204.

The substrate voltage generator 202 generates and outputs the bias voltage of the semiconductor substrate, and applies a negative substrate voltage Vbb to the semiconductor substrate.

The step-up voltage generator 203 steps up the power supply voltage from the power supply terminal Vcc to generate and supply step-up voltage Vpp to each of the memory array banks 209–212.

The address buffer 206 is connected to the address signal input terminals to which the address signals are input from an external source. These input terminals may include, for example, bank address terminals BA0 and BA1 from which the bank address selection signals are input, and the address terminals A0–A11 through which the address signals are input.

The control signal buffer 207 is connected to each of the control signal input terminals through which the control signals are input from external sources. These control signal input terminals include in this example the /CS terminal to which the chip selector signal is input, the /RAS terminal to which the row address strobe signal is input, the /CAS terminal to which the column address strobe signal is input, the /WE terminal to which the write enable signal is input, and the DQM terminal to which the I/O mask signal is input.

The clock buffer 208 generates the internal clock signal INTCLK from the externally supplied clock signal, and supplies the clock signal to the connected address buffer 206, control signal buffer 207, I/O buffer 213, and control circuit 215. The external clock signal is supplied to the clock buffer 208 through the CLK terminal, and the clock enable signal is supplied to the clock buffer 208 through the CKE terminal.

The control circuit 215 is connected to each of the memory array banks 209–212, the address buffer 206, the control signal buffer 207, and the I/O buffer 213. The mode register 214 is used by the control circuit 215 when determining the burst length from the address signals input from the address signal input terminals.

Current consumption is high when the frequency of the internal clock signal INTCLK is high compared with current consumption when the internal clock signal INTCLK is low, and the drop in the internal power supply voltage int.Vcc and step-up voltage Vpp output from the internal voltage step-down circuit 201 and step-up voltage generator 203 thus increases.

In addition, the negative substrate voltage Vbb output from the substrate voltage generator 202 tends to be higher when the frequency of the internal clock signal INTCLK is high compared with when the internal clock signal INTCLK is low.

SUMMARY OF THE INVENTION

With consideration for the above problems, an essential object of the present invention is to provide a semiconductor integrated circuit device comprising an internal power supply circuit capable of supplying to the internal circuits of the semiconductor integrated circuit device a stable supply voltage that does not vary with the frequency of the internal clock signal INTCLK.

It should be noted that while a semiconductor integrated circuit device which changes the operating voltage according to the clock frequency as a means of reducing current consumption by the circuit has been described in Japan Unexamined Patent Publication (kokai) 58-171842 (1983-171842) and Japan Unexamined Patent Publication (kokai) 4-112312 (1992-112312), the object and configuration of the devices in these disclosures differ from those of the present invention.

To achieve the above object, the internal voltage step-down means of a semiconductor integrated circuit device according to a first embodiment of the invention steps down a power supply voltage supplied from an external source to generate and output an internal power supply voltage based on a particular reference voltage An internal clock signal generator generates an internal clock signal based on a clock signal supplied from an external source, and a frequency discriminator determines the frequency of the internal clock signal generated by the internal clock signal generator. The internal voltage step-down means thus increases the speed at which the output current rises in response to a drop in the internal power supply voltage as the frequency identified by the frequency discriminator rises.

The internal voltage step-down means preferably further comprises a differential amplifier to which the output internal power supply voltage and a particular reference voltage are input, a gain control means for controlling the current flow to the differential amplifier to control the gain of the differential amplifier, and an output circuit for changing the current supply capacity according to the output voltage of the differential amplifier. In this case the gain control means increases the current flow to the differential amplifier and increases the gain of the differential amplifier as the internal clock signal frequency rises.

The gain control means yet further comprises plural MOS transistors of varying gate sizes for supplying current to the differential amplifier, and increases the current flow to the differential amplifier as the internal clock signal frequency rises by operating a MOS transistor with a larger drain current.

Alternatively, the gain control means comprises plural MOS transistors for supplying current to the differential amplifier, and increases the current flow to the differential amplifier as the internal clock signal frequency rises by increasing the number of operating MOS transistors.

In yet a further alternative embodiment, the gain control means comprises a MOS transistor for supplying current to the differential amplifier, and a gate voltage control circuit for controlling the gate voltage of the MOS transistor according to the internal clock signal. The gate voltage control circuit in this case controls the gate voltage of the MOS transistor to increase the current supply to the differential amplifier as the internal clock signal frequency rises.

In a further embodiment of the invention, the semiconductor integrated circuit device comprises a reference voltage generating means for generating and outputting plural different reference voltages. An internal voltage step-down means selects a reference voltage input from the reference voltage generating means, and steps down a power supply voltage supplied from an external source to generate an internal power supply voltage based on the selected reference voltage. An internal clock signal generator generates an internal clock signal based on a clock signal supplied from an external source, and a frequency discriminator determines the frequency of the internal clock signal generated by the internal clock signal generator. In this case, the internal voltage step-down means selects a higher reference voltage as the frequency determined by the frequency discriminator increases to compensate for a drop in the internal power supply voltage.

The internal voltage step-down means in this embodiment preferably comprises a reference voltage selection means for selecting a reference voltage output from the reference voltage generating means according to the internal clock signal frequency, a differential amplifier to which the output internal power supply voltage and the reference voltage selected by the reference voltage selection means are input, and an output circuit for changing the current supply capacity according to the output voltage of the differential amplifier. The reference voltage selection means in this case selects a higher reference voltage as the internal clock signal frequency rises.

In a yet further embodiment of the invention, the semiconductor integrated circuit device comprises an internal voltage step-down means for stepping down a power supply voltage supplied from an external source to generate and output an internal power supply voltage based on a particular reference voltage, an internal clock signal generator for generating an internal clock signal based on a clock signal supplied from an external source, and a frequency discriminator for determining the frequency of the internal clock signal generated by the internal clock signal generator. The internal voltage step-down means increases the output current supply capacity as the frequency determined by the frequency discriminator increases.

Preferably in this embodiment the internal voltage step-down means comprises a differential amplifier to which the output internal power supply voltage and a particular reference voltage are input, and an output circuit for changing the current supply capacity according to the internal clock signal frequency. The output circuit in this case increases the output current supply capacity as the internal clock signal frequency rises.

Further preferably, each of the preceding embodiments comprises a substrate voltage generating means for generating and outputting a semiconductor substrate bias voltage, and applying a substrate voltage to the semiconductor substrate. The response of the substrate voltage generating means to an increase in the substrate voltage improves, and the speed at which a rise in the substrate voltage is detected increases, as the frequency determined by the frequency discriminator rises.

Yet further preferably, each of the preceding embodiments comprises a step-up voltage generating means for generating and outputting a step-up voltage by boosting the externally supplied power voltage. The response of the step-up voltage generating means to a drop in the step-up voltage improves, and the speed at which a drop in the step-up voltage is detected increases, as the frequency determined by the frequency discriminator rises.

The substrate voltage generating means of the semiconductor integrated circuit device according to another embodiment of the invention generates and outputs a semiconductor substrate bias voltage, and applies a substrate voltage to the semiconductor substrate. An internal clock signal generator generates an internal clock signal based on a clock signal supplied from an external source, and a frequency discriminator determines the frequency of the internal clock signal generated by the internal clock signal generator. The response of the substrate voltage generating means to an increase in the substrate voltage improves, and the speed at which a rise in the substrate voltage is detected increases, as the frequency determined by the frequency discriminator rises in this embodiment.

The substrate voltage generating means of this embodiment preferably comprises a charge pump circuit for lowering the substrate voltage, and a substrate voltage detecting means for detecting the output substrate voltage, and operating the charge pump circuit when the substrate voltage exceeds a particular value. The response of the substrate voltage detecting means to an increase in the substrate voltage improves, and the speed at which it is detected that the substrate voltage exceeds a particular value increases, as the internal clock signal frequency rises in this embodiment.

In yet a further embodiment of the invention, the semiconductor integrated circuit device comprises a step-up voltage generating means for generating and outputting a step-up voltage by boosting the externally supplied power voltage. As in the above embodiment, an internal clock signal generator generates an internal clock signal based on a clock signal supplied from an external source, and a frequency discriminator determines the frequency of the internal clock signal generated by the internal clock signal generator. The response of the step-up voltage generating means to a drop in the step-up voltage improves, and the speed at which a drop in the step-up voltage is detected increases, as the internal clock signal frequency determined by the frequency discriminator rises.

The step-up voltage generating means of this embodiment preferably comprises a charge pump circuit for boosting the step-up voltage, and a step-up voltage detecting means for detecting the output step-up voltage, and operating the charge pump circuit when the step-up voltage falls below a particular value. The response of the step-up voltage detecting means to a drop in the step-up voltage improves,-and the speed at which a drop in the step-up voltage is detected increases, as the internal clock signal frequency rises.

BRIEF DESCRIPTION OF THE DRAWINGS

The present invention will become more fully understood from the detailed description given below and the accompanying diagrams wherein.

DESCRIPTION OF PREFERED EMBODIMENTS

The preferred embodiments of the present invention are described below with reference to the accompanying figures.

Embodiment 1

Figure 1:
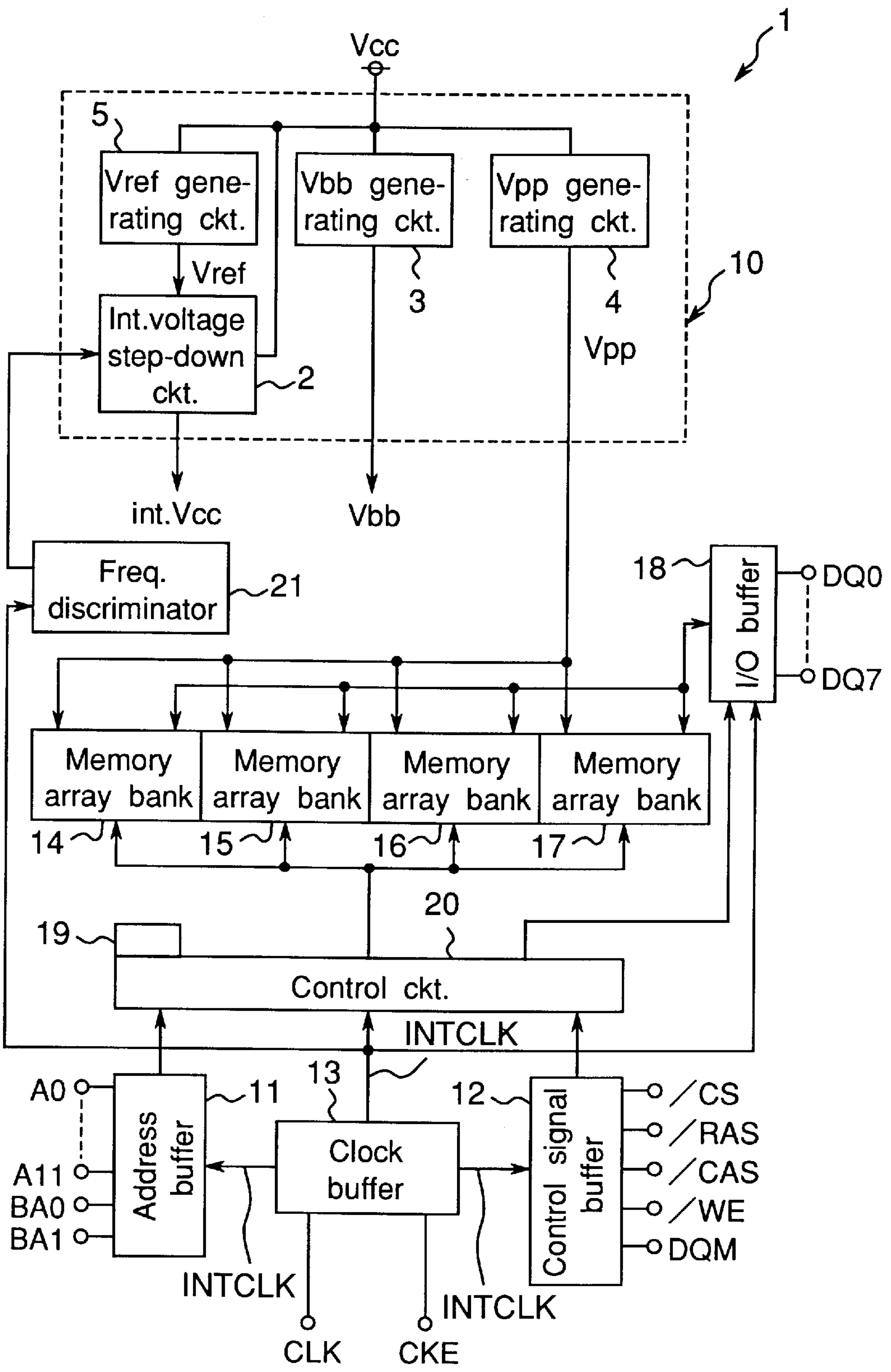
FIG. 1 is a block diagram of a semiconductor integrated circuit device according to a first embodiment of the present invention.

FIG. 1 is a block diagram of a semiconductor integrated circuit device according to a first embodiment of the present invention. Note that a 64 Mbit×8 synchronous DRAM device (SDRAM) is shown in FIG. 1 and used by way of example only below.

As shown in FIG. 1 SDRAM 1 comprises an internal power supply circuit 10, address buffer 11, control signal buffer 12, clock buffer 13, four memory array banks 14, 15, 16, and 17, an input/output (I/O) buffer 18 for data input/output, frequency detector 21 for detecting the clock frequency, and a control circuit 20 comprising a mode register 19 and controlling the memory array banks 14–17 and I/O buffer 18. The internal power supply circuit 10 further comprises an internal voltage step-down circuit 2, substrate voltage generator 3, step-up voltage generator 4, and a reference voltage generator 5 for generating and outputting the reference voltage Vref.

Note that the internal voltage step-down circuit 2 and reference voltage generator 5 function as an internal supply voltage step-down circuit, the clock buffer 13 functions as an internal clock signal generator, and the frequency detector 21 functions as a frequency discriminator.

The internal power supply circuit 10 is connected to the power supply terminal Vcc from which power is supplied from an external source. The reference voltage generator 5 is connected to the internal voltage step-down circuit 2. The internal voltage step-down circuit 2 is connected to the internal circuits of the SDRAM 1, but The clock buffer 13 is connected to the CLK terminal from which an externally supplied clock signal is input, and the CKE terminal from which an externally supplied clock enable signal is input. The clock buffer 13 is also connected to the address buffer 11, control signal buffer 12, I/O buffer 18, control circuit 20, and frequency detector 21. The frequency detector 21 is connected to the internal voltage step-down circuit 2.

The control circuit 20 is connected to each of the memory array banks 14–17 and to the I/O buffer 18. The I/O buffer 18 is connected to the data input/output terminals DQ0–DQ7 used for data input and output.

The internal voltage step-down circuit 2 steps down the power supply voltage input from an external source through the power supply terminal Vcc to generate the internal power supply voltage int.Vcc, and supplies the internal power supply voltage int.Vcc to the internal circuits of the SDRAM 1. Note that the internal power supply voltage int.Vcc is determined based on the reference voltage Vref input from the reference voltage generator 5. More specifically, the internal voltage step-down circuit 2 controls and outputs the internal power supply voltage int.Vcc at the level of the reference voltage Vref supplied from the reference voltage generator 5.

The substrate voltage generator 3 generates and these various connections are not shown in the figure. The substrate voltage generator 3 is connected to the semiconductor substrate on which the SDRAM 1 is formed, and these connections are also not shown. The step-up voltage generator 4 is connected to each of the four memory array banks 14–17.

The address buffer 11 is connected to the address signal input terminals to which the address signals are input from an external source. These input terminals may include, for example, bank address terminals BA0 and BA1 from which the bank address selection signals are input, and the address terminals A0–A11 through which the address signals are input. The address buffer 11 is also connected to the control signal buffer 12.

The control signal buffer 12 is connected to each of the control signal input terminals through which the control signals are input from external sources. These control signal input terminals include the /CS terminal to which the chip selector signal is input, the /RAS terminal to which the row address strobe signal is input, the /CAS terminal to which the column address strobe signal is input, the /WE terminal to which the write enable signal is input, and the DQM terminal to which the I/O mask signal is input. The control signal buffer 12 is also connected to the control circuit 20. outputs the bias voltage of the semiconductor substrate, and applies a negative substrate voltage Vbb to the semiconductor substrate.

The step-up voltage generator 4 steps up the power supply voltage from the power supply terminal Vcc to generate and supply step-up voltage Vpp to each of the memory array banks 14–17.

The clock buffer 13 generates and outputs the internal clock signal INTCLK from the externally supplied clock signal. This internal clock signal INTCLK is used to regulate the operation of the address buffer 11, control signal buffer 12, I/O buffer 18, and control circuit 20 connected to the clock buffer 13.

The control circuit 20 uses the mode register 19 when determining the burst length from the address signals input from the address signal input terminals. The frequency detector 21 detects the frequency of the internal clock signal INTCLK output from the clock buffer 13, and outputs to the internal voltage step-down circuit 2 a signal indicating whether the detected frequency exceeds a particular threshold value or is equal to or below that value.

Figure 2:
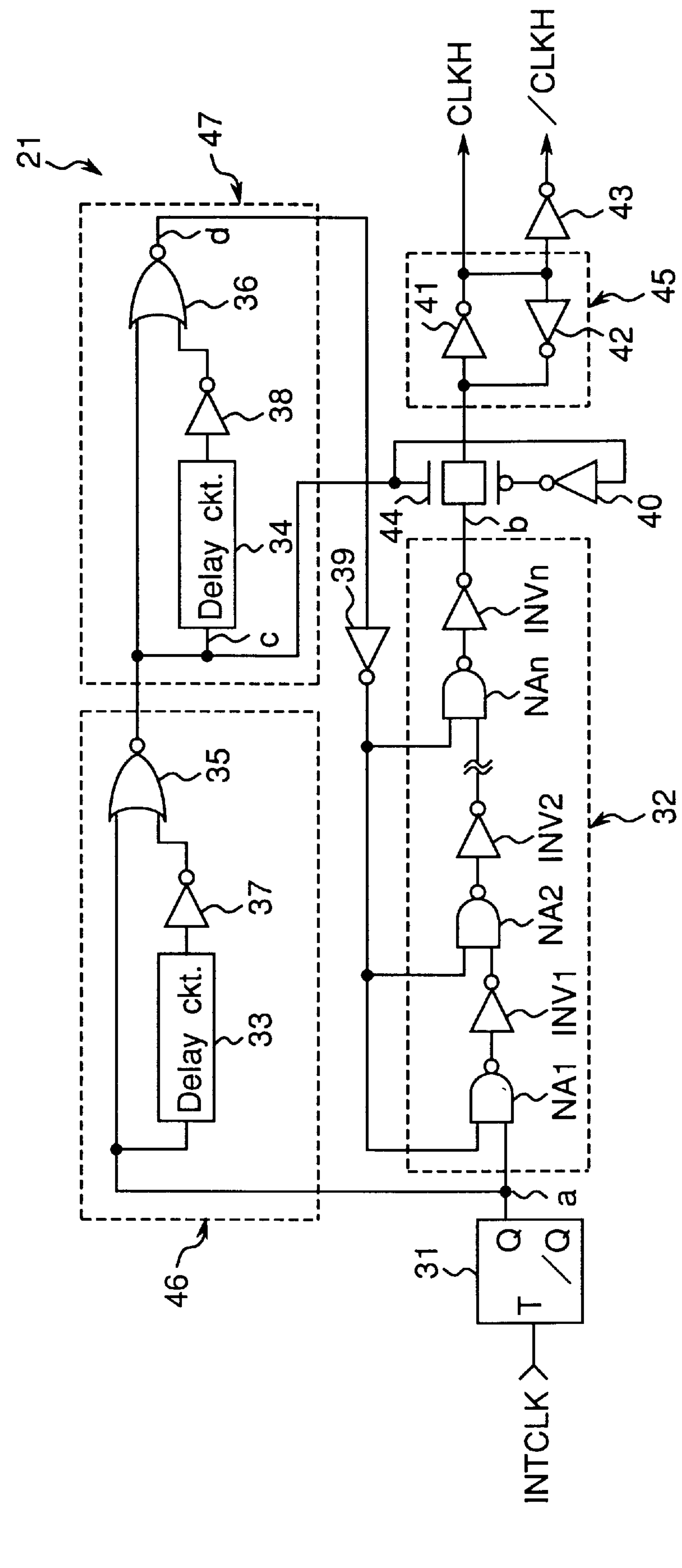
FIG. 2 is a circuit diagram of the frequency detector 21 shown in FIG. 1.

FIG. 2 is a schematic diagram of an exemplary frequency detector 21 of the invention. As shown in FIG. 2, the frequency detector 21 comprises a T flip-flop 31, delay circuits 32, 33, and 34, NOR gates 35 and 36, inverters 37 to 43, and transmission gate 44. Note that delay circuit 32 comprises n NAND gates NA1 to Nan and n inverters INV1 to INVn where n is a natural number.

As shown in FIG. 2, the output of NAND gate NA1 is supplied to the input of inverter INV1, and the output of inverter INV1 is supplied to one input of NAND gate NA2. The output of NAND gate NA2 is likewise supplied to the input of inverter INV2, and the output of inverter INV2 is supplied to one input of NAND gate NA3. This pattern is followed throughout to connect n NAND gates NA and n inverters INV until inverter INV(n−1) outputs to NAND gate NAn, NAND gate NAn outputs to inverter INVn, and inverter INVn then outputs to transmission gate 44 at a connection point b. Note that one input to the first NAND gate NA1 is connected to the non-inverted output Q of T flip-flop 31 at a connection point a.

As also shown in FIG. 2, delay circuit 33 outputs to inverter 37, which outputs to one input terminal of NOR gate 35. The input to delay circuit 33 and the other input to NOR gate 35 are connected to connection point a.

The output of delay circuit 34 is likewise supplied to inverter 38, and inverter 38 outputs to one input of NOR gate 36. The input to delay circuit 34 and the other input to NOR gate 36 are commonly connected to the output of NOR gate 35 at a connection point c.

The output of NOR gate 36 is supplied to the input of inverter 39 at a connection point do The output of inverter 39 is supplied to one input of each of the NAND gates NA1–NAn.

An n-channel MOS transistor and a p-channel MOS transistor form transmission gate 44. The gate of the n-channel MOS transistor is connected to the input to inverter 40 at connection point c. The output from inverter 40 is connected to the gate of the p-channel MOS transistor. The inputs and outputs of inverters 41 and 42 are interconnected in a loop forming a latch circuit 45. The input to this latch circuit 45 is connected to the output of the transmission gate 44. The output of inverter 41 is also an output of latch circuit 45 supplying a non-inverted output signal CLKH to the internal voltage step-down circuit 2 and to an inverter 43. Inverter 43 thus produces the inverted output signal /CLKH, which is also supplied from inverter 43 to the internal voltage step-down circuit 2.

Delay circuit 33, NOR gate 35, and inverter 37 form a monostable multivibrator 46. Delay circuit 34, NOR gate 36, and inverter 38 likewise form another monostable multivibrator 47. The internal clock signal INTCLK is supplied from the clock buffer 13 to the input T of the T flip-flop 31, which inverts the signal level of the output signal at the rise of the supplied internal clock signal INTCLK.

Figure 3:
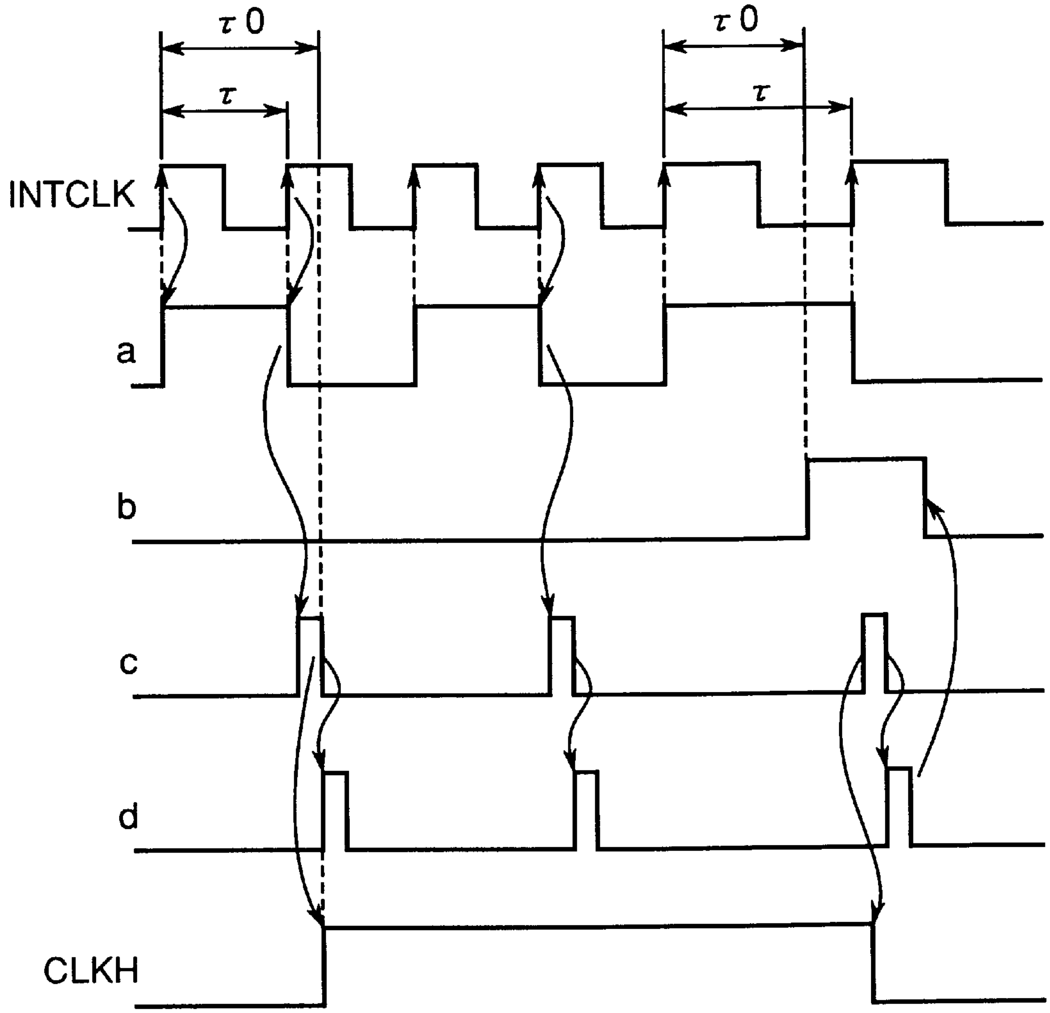
FIG. 3 is a timing chart used to describe the operation of the frequency detector 21 shown in FIG. 2.

FIG. 3 is a timing chart used to describe the operation of the frequency detector 21 shown in FIG. 2 below.

Referring to FIG. 3, the delay time of the delay circuit 32 is t0 where the period of the internal clock signal INTCLK is t, and a, b, c, and d indicate the signal level at the respective connection points. As shown in the figure, the signal level at connection point a becomes HIGH at the rise of internal clock signal INTCLK and after time t connection point a reverts to LOW. A one-shot pulse signal is produced at connection point c every time connection point a goes LOW from HIGH.

If t<t0, a HIGH one-shot pulse signal is produced at connection c before the HIGH signal level at connection a passes to connection b. Transmission gate 44 thus becomes on and conducting, and then switches off and non-conducting. The input to the latch circuit 45 is therefore LOW, the non-inverted output signal CLKH from the frequency detector 21 is HIGH, and the inverted output signal /CLKH is LOW.

On the other hand, if t≧t0, a HIGH one-shot pulse signal is produced at connection c after the HIGH signal level at connection a passes to connection b, and transmission gate 44 becomes on and conducting, and then switches off and non-conducting. The input to the latch circuit 45 is therefore HIGH, the non-inverted output signal CLKH from the frequency detector 21 is LOW, and the inverted output signal /CLKH is HIGH.

As a result of the operation thus described, the frequency detector 21 outputs LOW non-inverted output signal CLKH and a HIGH inverted output signal /CLKH when the frequency of the internal clock signal INTCLK input from the clock buffer 13 is less than or equal to a particular frequency level, and outputs a HIGH non-inverted output signal CLKH and a LOW inverted output signal /CLKH when INTCLK exceeds said particular frequency level. It should be noted that the monostable multivibrator 47 outputs a signal resetting the pulse signal remaining in the delay circuit 32 after the transmission gate 44 switches according to the one-shot pulse signal output by the other monostable multivibrator 46.

Figure 4:
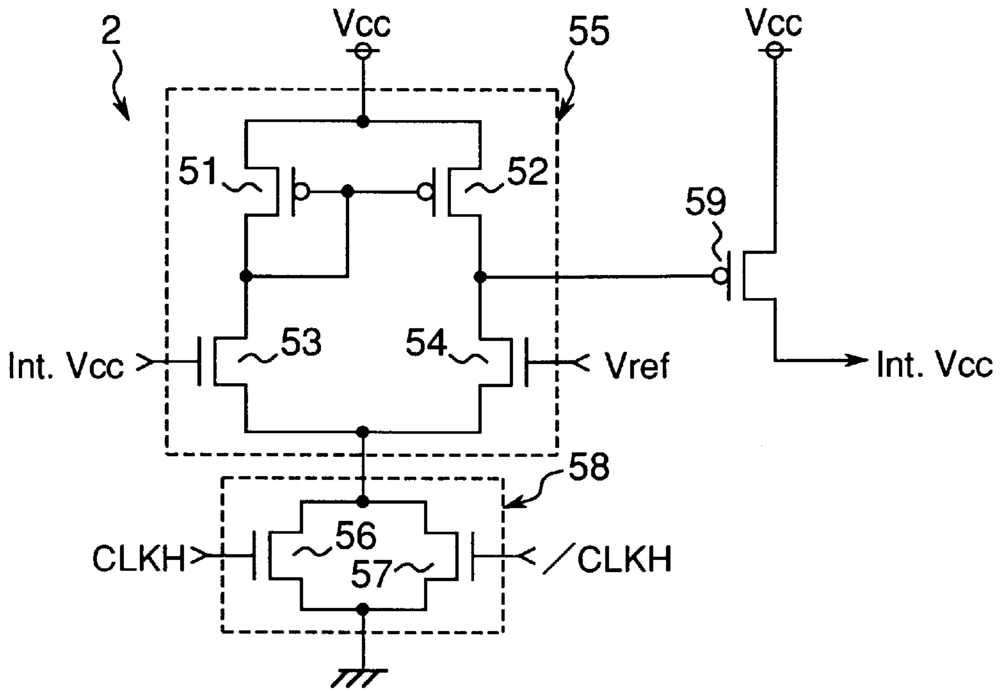
FIG. 4 is a circuit diagram of the internal voltage step-down circuit 2 shown in FIG. 1.

FIG. 4 is a circuit diagram of the internal voltage step-down circuit 2.

As shown in FIG. 4, the internal voltage step-down circuit 2 comprises a differential amplifier 55, a gain control circuit 58 for controlling the gain of the differential amplifier 55, and a p-channel MOS transistor 59 constituting the output circuit of the claims.

The differential amplifier 55 comprises two p-channel MOS transistors 51 and 52 and two n-channel MOS transistors 53 and 54. The gain control circuit 58 comprises two n-channel MOS transistors 56 and 57. Note that the differential amplifier 55 constitutes the differential amplifier of the claims, the gain control circuit 58 constitutes the gain control means of the claims, and the p-channel MOS transistor 59 constitutes the output circuit of the claims.

The gates of the p-channel MOS transistors 51 and 52 of the differential amplifier 55 are mutually connected, and this gate connection is connected to the drain of the p-channel MOS transistor 51. The sources of both p-channel MOS transistors 51 and 52 are connected to the power supply terminal Vcc. The drain of p-channel MOS transistor 51 is connected to the drain of n-channel MOS transistor 53. The drain of p-channel MOS transistor 52 is connected to the drain of n-channel MOS transistor 54, and this drain connection is connected to the gate of p-channel MOS transistor 59.

The internal power supply voltage int.Vcc output from the internal voltage step-down circuit 2 is input to the gate of n-channel MOS transistor 53. The gate of n-channel MOS transistor 54 is connected to the reference voltage generator 5, and the reference voltage Vref is thus supplied therefrom to said gate. The sources of n-channel MOS transistors 53 and 54 are mutually connected, and this source connection is connected to the mutual drain connection of n-channel MOS transistors 56 and 57 in the gain control circuit 58.

The sources of the n-channel MOS transistors 56 and 57 are mutually connected to a common ground. The gates of the n-channel MOS transistors 56 and 57 are connected to the frequency detector 21. The gate of n-channel MOS transistor 56 is connected to the non-inverted output signal CLKH output from the latch circuit 45 of the frequency detector 21, and the gate of n-channel MOS transistor 57 is connected to the inverted output signal /CLKH output from the n-channel MOS transistor 43 of the frequency detector 21. The source of p-channel MOS transistor 59 is connected to the power supply terminal Vcc, and the drain of p-channel MOS transistor 59 is used as the output terminal of the internal voltage step-down circuit 2. As a result, the internal power supply voltage int.Vcc is output from the drain of p-channel MOS transistor 59.

It should be noted that in this configuration the n-channel MOS transistors 56 and 57 forming the gain control circuit 58 have gates of different capacities such that more current can flow through n-channel MOS transistor 56 than n-channel MOS transistor 57. In other words, the gate of n-channel MOS transistor 57 is either narrower or longer than the gate of n-channel MOS transistor 56.

As a result, when the frequency of the internal clock signal INTCLK is less than or equal to a particular level, the non-inverted output signal CLKH from frequency detector 21 is LOW and the inverted output signal /CLKH from frequency detector 21 is HIGH, n-channel MOS transistor 56 is off, n-channel MOS transistor 57 is on, and drain current id57 flows through n-channel MOS transistor 57.

When the frequency of the internal clock signal INTCLK exceeds a particular level, the non-inverted output signal CLKH from frequency detector 21 is HIGH and the inverted output signal /CLKH from frequency detector 21 is LOW, n-channel MOS transistor 56 is on, n-channel MOS transistor 57 is off, and drain current id56 flows to n-channel MOS transistor 56.

Because n-channel MOS transistor 56 is formed to pass more current than n-channel MOS transistor 57, id56>id57. More specifically, the current flowing to the differential amplifier 55 is greater when n-channel MOS transistor 56 is on than when n-channel MOS transistor 57 is on.

The greater the current flowing to differential amplifier 55, the greater the gain of differential amplifier 55 and the better the response As a result, the gate voltage of p-channel MOS transistor 59 can be dropped quickly when there is a drop in the internal power supply voltage int.Vcc. Current flow also increases when the gate voltage of p-channel MOS transistor 59 drops.

It is therefore possible to rapidly increase the current flow in a short time in response to a drop in the internal power supply voltage int.Vcc and thereby supply more power when the frequency of the internal clock signal INTCLK exceeds a particular level than when the frequency is less than or equal to a particular level, and it is thus possible to prevent a drop in the internal power supply voltage int.Vcc.

Figure 5:
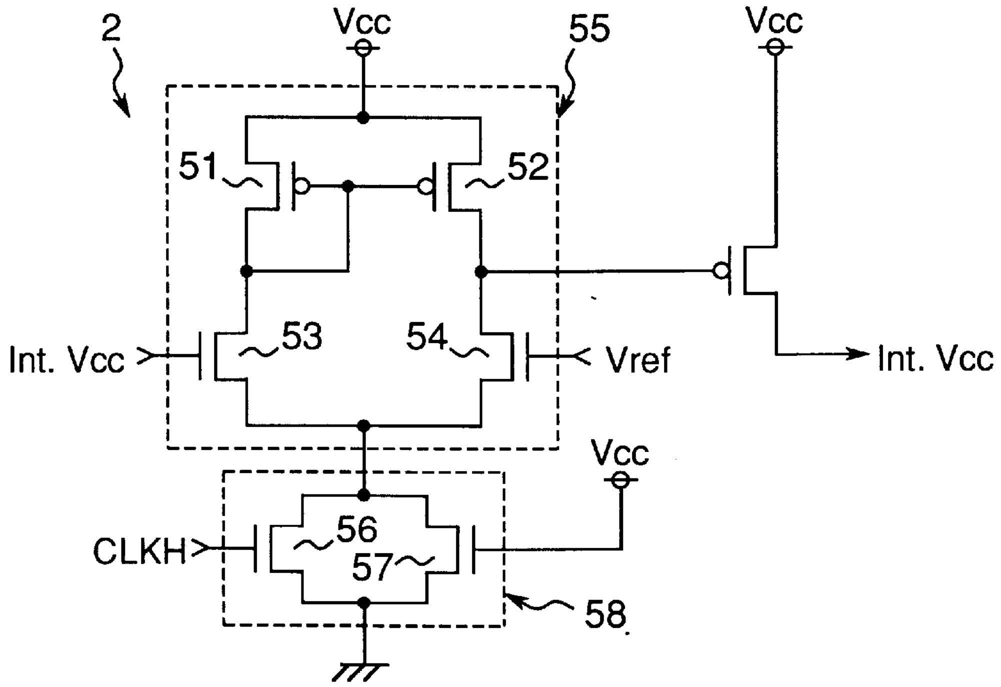
FIG. 5 is a circuit diagram of an alternative embodiment of the internal voltage step-down circuit 2 shown in FIG. 4.

It should be noted that while the gate of n-channel MOS transistor 57 is connected to the output from the n-channel MOS transistor 43 of the frequency detector 21 in the embodiment shown in FIG. 4, it is also possible to connect the gate of n-channel MOS transistor 57 to the power supply terminal Vcc rather than to the inverted output signal /CLKH as shown in FIG. 5 so that the gate is always HIGH and the n-channel MOS transistor 57 is always on.

If thus comprised only n-channel MOS transistor 57 will be on when the frequency of the internal clock signal INTCLK is less than or equal to a particular level, and when the frequency of the internal clock signal INTCLK exceeds a particular level both n-channel MOS transistors 56 and 57 will be on. As a result the current flowing to the differential amplifier 55 will be greater when the frequency of the internal clock signal INTCLK exceeds a particular level than when the frequency of the internal clock signal INTCLK is less than or equal to a particular level, and the same effects as achieved with the configuration shown in FIG. 4 can be achieved.

The semiconductor integrated circuit device according to the first embodiment of the invention thus adjusts the response by changing the gain of the differential amplifier 55 of the internal voltage step-down circuit 2 according to the frequency of the internal clock signal INTCLK. More specifically, the gain of the differential amplifier 55 is greater when the frequency of the internal clock signal INTCLK exceeds a particular level than when it is less than or equal to a particular level, and the response of the internal voltage step-down circuit 2 is thus improved.

The internal voltage step-down circuit 2 can thus supply more current in a short time in response to a potential drop in the internal power supply voltage int.Vcc when the frequency of the internal clock signal INTCLK exceeds a particular level compared with when said frequency is below this level, and the drop in the internal power supply voltage int.Vcc that occurs in conventional devices when the frequency of the internal clock signal INTCLK is high can be prevented It is also possible to reduce current consumption by the differential amplifier 55 when the burst length is short, and the current consumption of a SDRAM device can be reduced.

Embodiment 2

The first embodiment as described above comprises a gain control circuit 58 consisting of n-channel MOS transistors 56 and 57, and operates these two n-channel MOS transistors 56 and 57 so that the current flowing to the differential amplifier 55 is different when the frequency of the internal clock signal INTCLK is high and low. By thus changing the current flow to the differential amplifier 55, the gain control circuit 58 changes the gain of differential amplifier 55 and thereby changes the response of the internal voltage step-down circuit 2.

It is also possible, however, to control the current flowing to the differential amplifier 55 using a single n-channel MOS transistor as described below according to the second embodiment of the invention.

Figure 6:
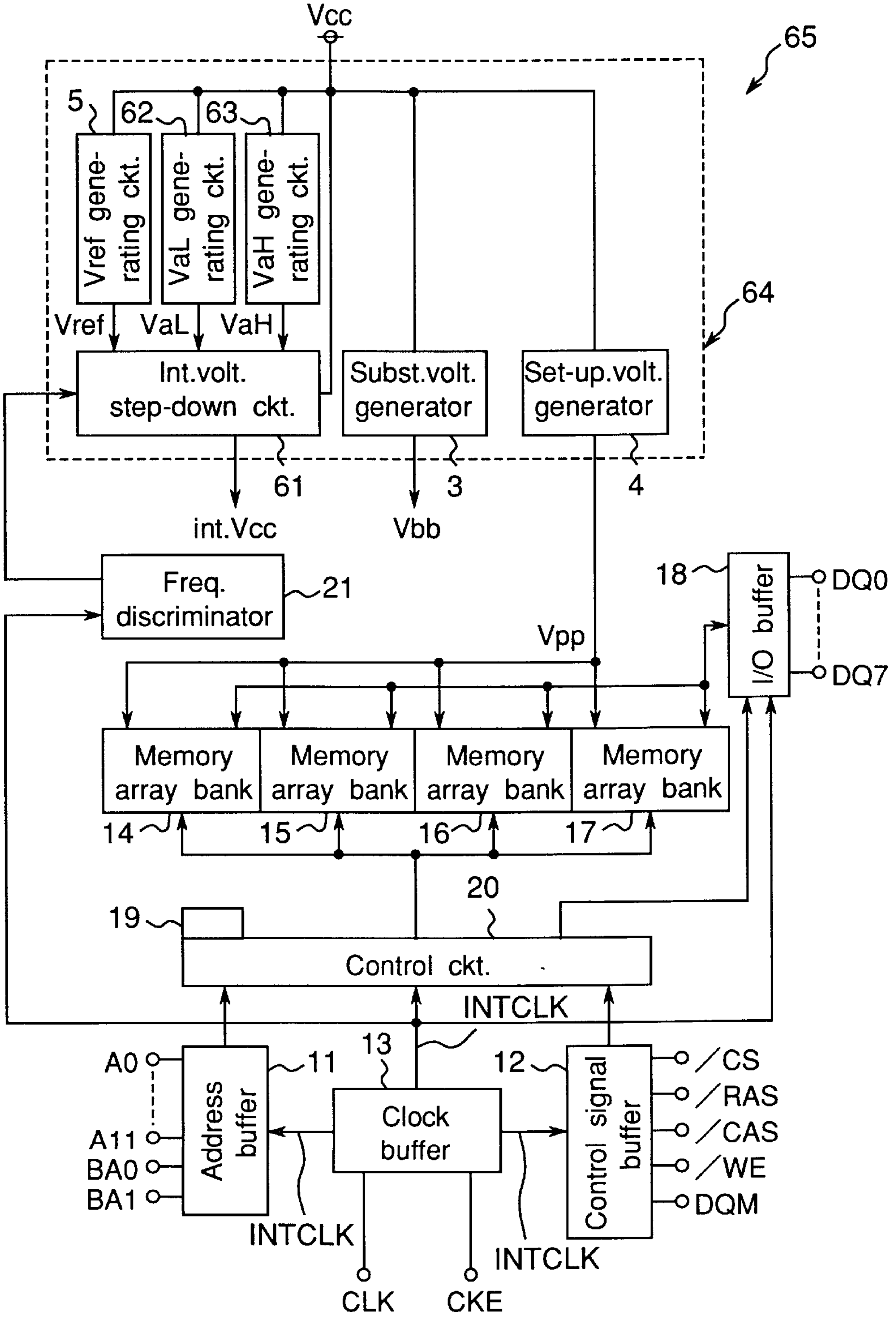
FIG. 6 is a block diagram of a semiconductor integrated circuit device according to the second embodiment of the invention.

FIG. 6 is a block diagram of a semiconductor integrated circuit device according to the second embodiment of the invention, which is described below using by way of example only a 64 Mbit×8 synchronous DRAM (SDRAM) device. Note that like parts in FIG. 6 and FIG. 1 are identified by the same reference numbers, and further description thereof is omitted below. Only the differences between the first embodiment above and the second embodiment are described below.

The semiconductor integrated circuit device shown in FIG. 6 differs from that in FIG. 1 in the construction of the internal power supply circuit. More specifically, the circuit design of the internal voltage step-down circuit 61 of the internal power supply circuit 64 of the second embodiment has been changed from that of the internal voltage step-down circuit 2 in FIG. 1 The internal power supply circuit 64 further comprises a first voltage generator 62 for generating and outputting a particular voltage VaL, and a second voltage generator 63 for generating and outputting a particular voltage VaH, in addition to the internal voltage step-down circuit 61, reference voltage generator 5, substrate voltage generator 3, and step-up voltage generator 4.

The SDRAM 65 of this second embodiment thus comprises as shown in FIG. 6 an internal power supply circuit 64 as described above, an address buffer 11, control signal buffer 12, clock buffer 13, four memory array banks 14–17, an input/output (I/O) buffer 18 for data input/output, a frequency detector 21, and a control circuit 20 comprising a mode register 19 and controlling the memory array banks 14–17 and I/O buffer 18.

The internal power supply circuit 64 is connected to the power supply terminal Vcc from which power is supplied from an external source. The reference voltage generator 5, first voltage generator 62, and second voltage generator 63 are connected to the internal voltage step-down circuit 61. The internal voltage step-down circuit 61 is connected to the internal circuits of the SDRAM 1, but these various connections are not shown in the figure. The frequency detector 21 is also connected to the internal voltage step-down circuit 61.

The internal voltage step-down circuit 61 steps down the power supply voltage input from an external source through the power supply terminal Vcc to generate the internal power supply voltage int.Vcc, and supplies the internal power supply voltage int.Vcc to the internal circuits of the SDRAM 65. Note that the internal power supply voltage int.Vcc is determined based on the reference voltage Vref input from the reference voltage generator 5. More specifically, the internal voltage step-down circuit 61 controls and outputs the internal power supply voltage int.Vcc at the level of the reference voltage Vref supplied from the reference voltage generator 5. The current supply capacity of the internal voltage step-down circuit 61 is switched according to the internal clock signal frequency signal output from the frequency detector 21.

Figure 7:
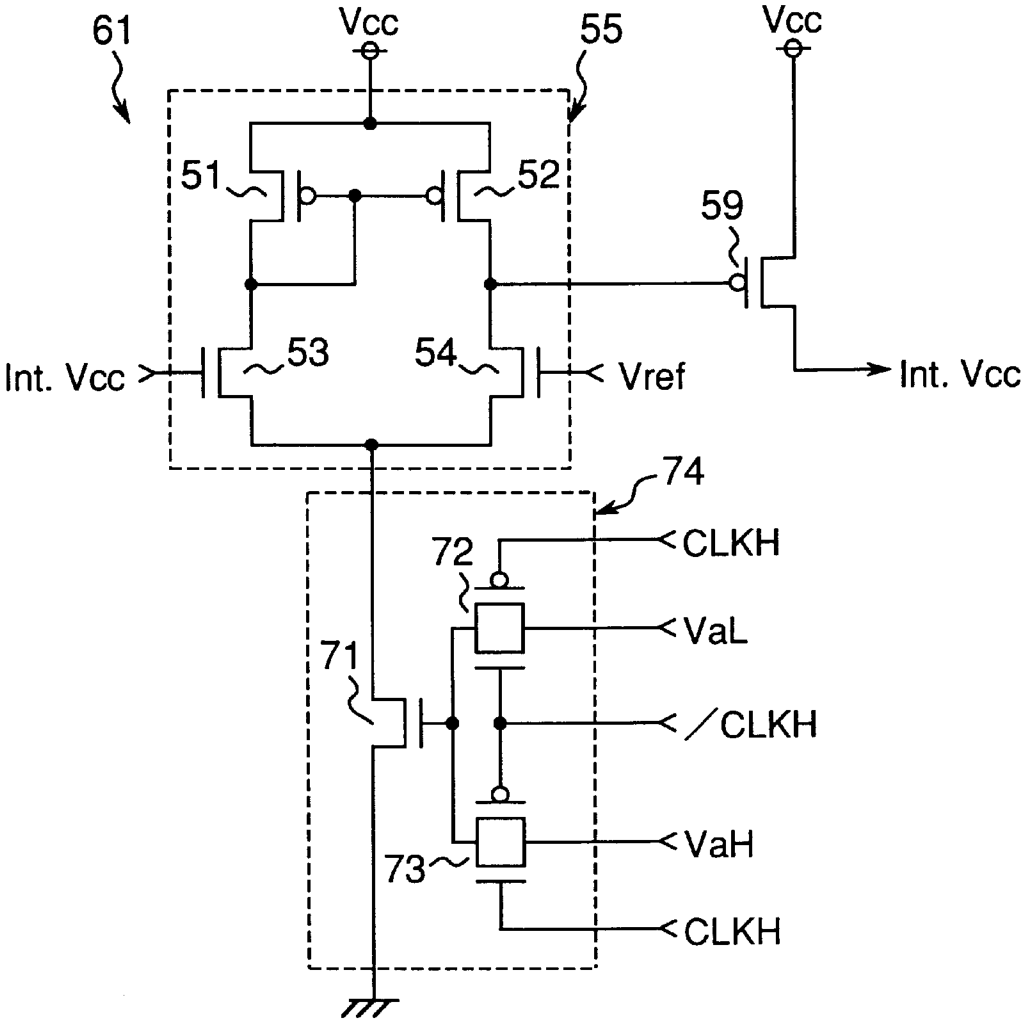
FIG. 7 is a circuit diagram of the internal voltage step-down circuit 61 shown in FIG. 6.

FIG. 7 is a circuit diagram of the internal voltage step-down circuit 61. Note that like parts in FIG. 7 and FIG. 4 are identified by the same reference numbers, and further description thereof is omitted below where only the differences are explained.

The internal voltage step-down circuit 61 shown in FIG. 7 differs from that in FIG. 4 in the construction of the gain control circuit 74, which comprises in this embodiment an n-channel MOS transistor 71 and two transmission gates 72 and 73.

It should be noted that the gain control circuit 74, first voltage generator 62, and second voltage generator 63 constitute the gain control means of the claims, and the transmission gates 72 and 73 constitute the gate voltage control circuit of the claims.

As shown in FIG. 7, the internal voltage step-down circuit 61 comprises a differential amplifier 55, a gain control circuit 74, and a p-channel MOS transistor 59 functioning as the output circuit of the internal voltage step-down circuit 61. The gain control circuit 74 comprises n-channel MOS transistor 71, transmission gates 72 and 73, and controls the gain of the differential amplifier 55.

The sources of the n-channel MOS transistors 53 and 54 are connected together, and this source connection is connected to the drain of the n-channel MOS transistor 71. The source of the n-channel MOS transistor 71 is grounded. The gate of the n-channel MOS transistor 71 is connected to the outputs of the transmission gates 72 and 73. The input of transmission gate 72 is connected to the first voltage generator 62, and the input of the other transmission gate 73 is connected to the second voltage generator 63.

The non-inverted output signal CLKH output from the from the latch circuit 45 of the frequency detector 21 is connected to the gate of the p-channel MOS transistor that is part of transmission gate 72, and the gate of the n-channel MOS transistor that is part of the other transmission gate 73. The inverted output signal /CLKH from the from the n-channel MOS transistor 43 of the frequency detector 21 is connected to the gate of the n-channel MOS transistor of transmission gate 72, and to the gate of the p-channel MOS transistor of transmission gate 73.

Thus comprised, the particular voltage VaL output from the first voltage generator 62 is input to the input of the transmission gate 72, and the particular voltage VaH from the second voltage generator 63 is input to the input of transmission gate 73. Note that VaH>VaL.

When the frequency of the internal clock signal INTCLK is less than or equal to a particular level, the non-inverted output signal CLKH is LOW, and the inverted output signal /CLKH is HIGH. As a result, transmission gate 72 is on and conducting, transmission gate 73 is off and non-conducting, and the particular voltage VaL is input to the gate of n-channel MOS transistor 71.

When the frequency of the internal clock signal INTCLK exceeds a particular level, the non-inverted output signal CLKH is HIGH and the inverted output signal /CLKH is LOW. In this case transmission gate 72 is off and non-conducting, and transmission gate 73 is on and conducting and the particular voltage VaH is input to the gate of n-channel MOS transistor 71.

Because VaH>VaL, the voltage input to the gate of n-channel MOS transistor 71 is higher when the frequency of the internal clock signal INTCLK exceeds a particular level than when it is less than or equal to a particular level. In other words, the drain current of the n-channel MOS transistor 71 increases and the current flowing to the differential amplifier 55 increases.

The greater the current flowing to differential amplifier 55, the greater the gain of differential amplifier 55 and the better the response. As a result, the gate voltage of p-channel MOS transistor 59 can be dropped quickly when there is a drop in the internal power supply voltage int.Vcc. Current flow also increases when the gate voltage of p-channel MOS transistor 59 drops.

It is therefore possible to supply more current in a short time in response to a potential drop in the internal power supply voltage int.Vcc when the frequency of the internal clock signal INTCLK exceeds a particular level compared with when said frequency is below this level, and the drop in the internal power supply voltage int.Vcc that occurs in conventional devices when the frequency of the internal clock signal INTCLK is high can be prevented.

The semiconductor integrated circuit device according to the second embodiment of the invention thus adjusts the response by changing the gain of the differential amplifier 55 of the internal voltage step-down circuit 61 according to the frequency of the internal clock signal INTCLK. More specifically, the gain of the differential amplifier 55 is greater when the frequency of the internal clock signal INTCLK exceeds a particular level than when it is less than or equal to a particular level, and the response of the internal voltage step-down circuit 61 is thus improved. When the frequency of the internal clock signal INTCLK exceeds a particular level, the internal voltage step-down circuit 61 can thus supply more current in a short time in response to a potential drop in the internal power supply voltage int.Vcc, and the drop in the internal power supply voltage int.Vcc that occurs in conventional devices when the frequency of the internal clock signal INTCLK is high can be prevented. It is also possible to reduce current consumption by the differential amplifier 55 when the burst length is short, and the current consumption of a SDRAM device can be reduced.

Embodiment 3

The first and second embodiments as described above change the current flow to the differential amplifier 55 to change the gain of the differential amplifier 55 and thereby change the response of the internal voltage step-down circuit. It is also possible, however, to change the gate voltage input to the gate of the n-channel MOS transistor 54 of the differential amplifier 55, i.e., the reference voltage, when the frequency of the internal clock signal INTCLK exceeds a particular level and is less than or equal to a particular level to compensate for the drop in the internal power supply voltage int.Vcc that occurs when the frequency of the internal clock signal INTCLK is high. A semiconductor integrated circuit device that operates in this manner is described below as the third embodiment of the invention.

Figure 8:
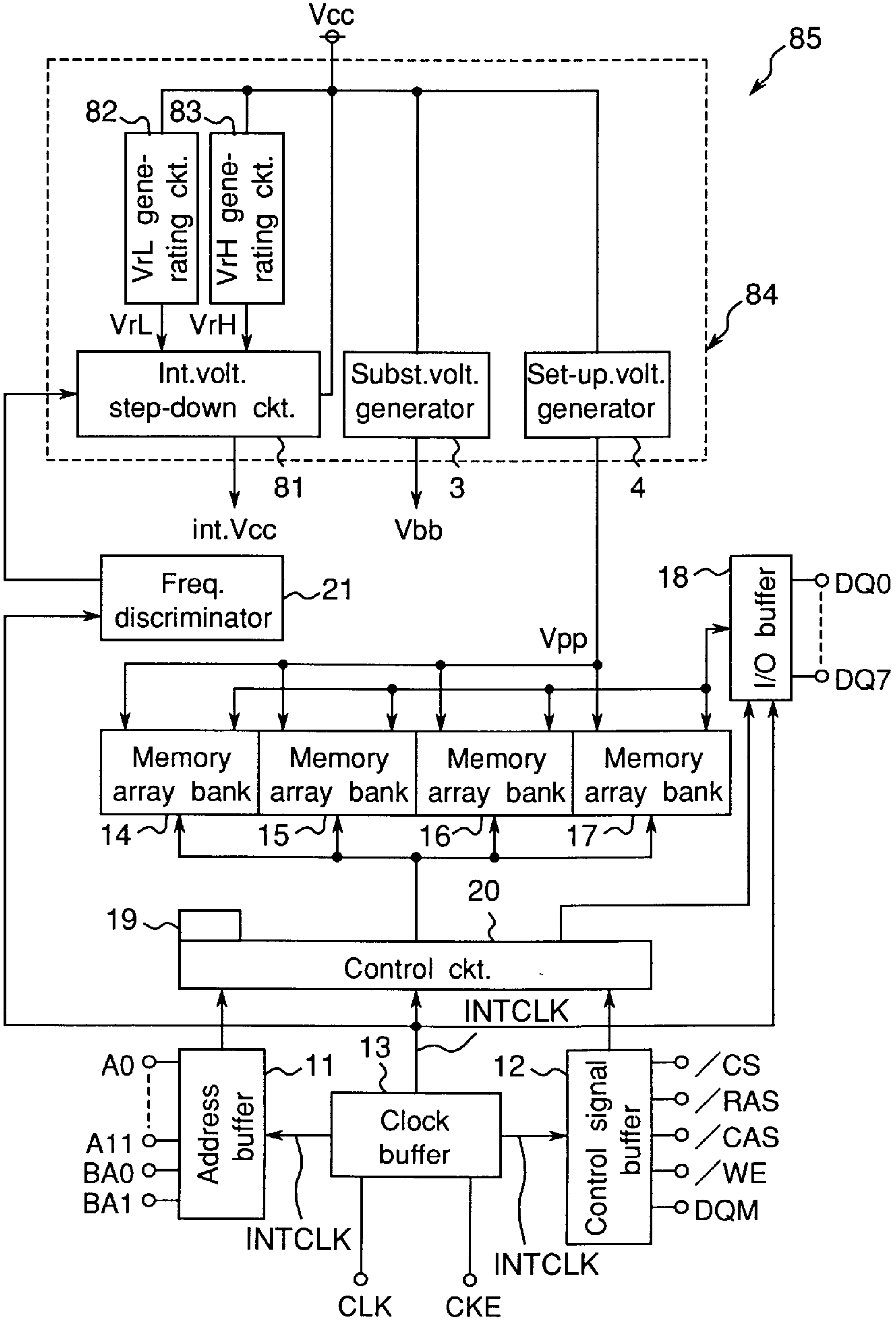
FIG. 8 is a block diagram of a semiconductor integrated circuit device according to the third embodiment of the invention.

FIG. 8 is a block diagram of a semiconductor integrated circuit device according to the third embodiment of the invention, which is described below using by way of example only a 64 Mbit×8 synchronous DRAM (SDRAM) device. Note that like parts in FIG. 8 and FIG. 1 are identified by the same reference numbers, and further description thereof is omitted below. Only the differences between the first embodiment above and the third embodiment are described below.

The semiconductor integrated circuit device shown in FIG. 8 differs from that in FIG. 1 in the construction of the internal power supply circuit 84. More specifically, the circuit design of the internal voltage step-down circuit 81 of the internal power supply circuit 84 of the third embodiment has been changed from that of the internal voltage step-down circuit 2 in FIG. 1; the reference voltage generator 5 has been eliminated; and a first reference voltage generator 82 for generating and outputting reference voltage VrL, and second reference voltage generator 83 for generating and outputting reference voltage VrH have been added.

The internal power supply circuit 84 of the SDRAM 85 of this third embodiment thus comprises an internal voltage step-down circuit 81, first reference voltage generator 82, second reference voltage generator 83, substrate voltage generator 3, and step-up voltage generator 4.

As shown in FIG. 8, the SDRAM 85 of this third embodiment thus comprises the above internal power supply circuit 84, an address buffer 11, control signal buffer 12, clock buffer 13, four memory array banks 14–17, an input/output (I/O) buffer 18 for data input/output, frequency detector 21, and a control circuit 20 comprising a mode register 19 and controlling the memory array banks 14–17 and I/O buffer 18.

The internal power supply circuit 84 is connected to the power supply terminal Vcc from which power is supplied from an external source. The first reference voltage generator 82 and second reference voltage generator 83 are connected to the internal voltage step-down circuit 81, and the internal voltage step-down circuit 81 is connected to the internal circuits of the SDRAM 85, but these various connections ate not shown in the figure The frequency detector 21 is also connected to the internal voltage step-down circuit 81.

The internal voltage step-down circuit 81 steps down the power supply voltage input from an external source through the power supply terminal Vcc to generate the internal power supply voltage int.Vcc, and supplies the internal power supply voltage int.Vcc to the internal circuits of the SDRAM 85. Note that the internal power supply voltage int.Vcc is determined based on the reference voltage VrL input from the first reference voltage generator 82 or the reference voltage VrH input from the second reference voltage generator 83. More specifically, the internal voltage step-down circuit 81 controls and outputs the internal power supply voltage int.Vcc at the level of the reference voltage VrL input from the first reference voltage generator 82 or the reference voltage VrH input from the second reference voltage generator 83. The internal voltage step-down circuit 81 selects reference voltage VrL or VrH according to the frequency of the internal clock signal INTCLK output from the frequency detector 21.

Figure 9:
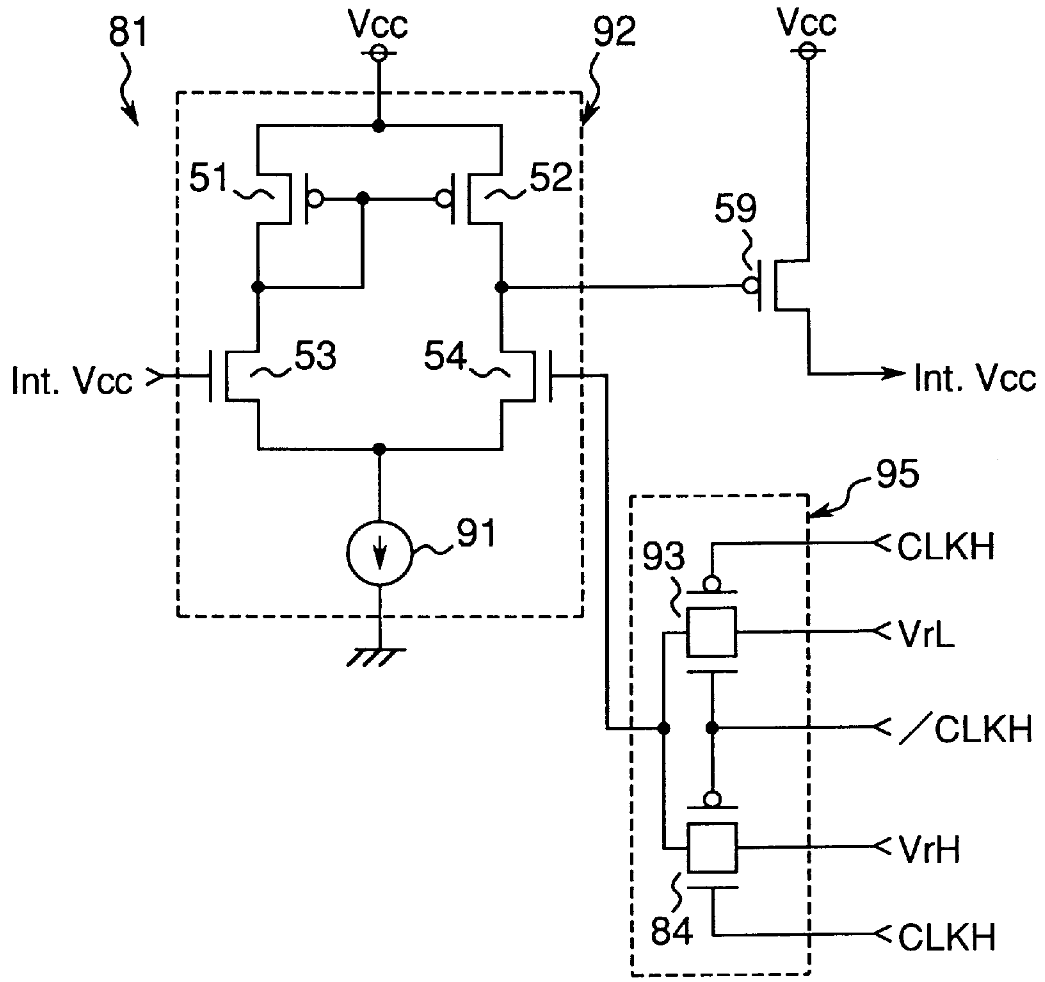
FIG. 9 is a circuit diagram of the internal voltage step-down circuit 81 shown in FIG. 8.

FIG. 9 is a circuit diagram of the internal voltage step-down circuit 81. Note that like parts in FIG. 9 and FIG. 4 are identified by the same reference numbers, and further description thereof is omitted below where only the differences are explained.

The internal voltage step-down circuit 81 shown in FIG. 9 differs from that in FIG. 4 in that the gain control circuit 58 shown in FIG. 4 is eliminated; the differential amplifier 92 includes a constant current supply 91 added to the differential amplifier 55 in FIG. 4; and a reference voltage switching circuit 95 comprising transmission gates 93 and 94 is added.

It should be noted that the differential amplifier 92 constitutes the differential amplifier circuit of the claims, and the reference voltage switching circuit 95 constitutes the reference voltage selector of the claims.

As shown in FIG. 9, the internal voltage step-down circuit 81 comprises a differential amplifier 92, reference voltage switching circuit 95, and p-channel MOS transistor 59 functioning as the output circuit of the internal voltage step-down circuit 81.

The differential amplifier 92 comprises two p-channel MOS transistors 51 and 52, two n-channel MOS transistors 53 and 54, and the constant current supply 91. The constant current supply 91 is inserted between the ground and the common source connection of the n-channel MOS transistors 53 and 54.

The reference voltage switching circuit 95 comprises transmission gates 93 and 94, the outputs of which are connected to the gate of n-channel MOS transistor 54. The input of the one transmission gate 93 is connected to the first reference voltage generator 82, and the input of the other transmission gate 94 is connected to the second reference voltage generator 83.

The non-inverted output signal CLKH is output from the latch circuit 45 of the frequency detector 21 to the gate of the p-channel MOS transistor of transmission gate 93 and the n-channel MOS transistor of transmission gate 94, and the inverted output signal /CLKH is output from the from the n-channel MOS transistor 43 of the frequency detector 21 to the n-channel MOS transistor gate of transmission gate 93 and the p-channel MOS transistor gate of transmission gate 94.

Thus comprised, the reference voltage VrL output from the first reference voltage generator 82 is input to the input of the connected transmission gate 93, and the reference voltage VrH output from the second reference voltage generator 83 is input to the connected transmission gate 94. Note that VrH>VrL.

When the frequency of the internal clock signal INTCLK is less than or equal to a particular level the non-inverted output signal CLKH is LOW and the inverted output signal /CLKH is HIGH. As a result, transmission gate 94 is off and non-conducting, and transmission gate 93 is on and conducting and reference voltage VrL is input to the gate of n-channel MOS transistor 54.

When frequency of the internal clock signal INTCLK exceeds a particular level, the non-inverted output signal CLKH is HIGH and the inverted output signal /CLKH is LOW. In this case transmission gate 93 is off and non-conducting, and transmission gate 94 is on and conducting and reference voltage VrH is input to the gate of n-channel MOS transistor 54.

Because VrH>VrL, the voltage input to the gate of n-channel MOS transistor 54 is higher when the frequency of the internal clock signal INTCLK exceeds a particular level than when it is less than or equal to a particular level. In other words, increasing the reference voltage of the differential amplifier 92 increases the internal power supply voltage int.Vcc output from the internal voltage step-down circuit 81, and can thus compensate for the drop in the internal power supply voltage int.Vcc when the frequency of the internal clock signal INTCLK is high.

The semiconductor integrated circuit device according to the third embodiment of the invention can thus change the internal power supply voltage int.Vcc output by the internal voltage step-down circuit 81 according to the frequency of the internal clock signal INTCLK. More specifically, the internal power supply voltage int.Vcc output by the internal voltage step-down circuit 81 can be made higher when the frequency of the internal clock signal INTCLK exceeds a particular level than when it is less than or equal to a particular level, and it is possible to compensate for the drop in the internal power supply voltage int.Vcc that tends to occur when the frequency of the internal clock signal INTCLK is high. It is thus possible to prevent the drop in the internal power supply voltage int.Vcc that occurs when the frequency of the internal clock signal INTCLK is high.

Embodiment 4

A drop in the internal power supply voltage int.Vcc is prevented in the first to third embodiments described above using a single p-channel MOS transistor as the output circuit of the internal voltage step-down circuit. As described below according to the fourth embodiment, however, it is also possible to change the output current capacity of the internal voltage step-down circuit by using plural p-channel MOS transistors of differing gate sizes in the output circuit of the internal voltage step-down circuit, and changing the number of output circuit p-channel MOS transistors that are on according to the frequency of the internal clock signal INTCLK.

Figure 10:
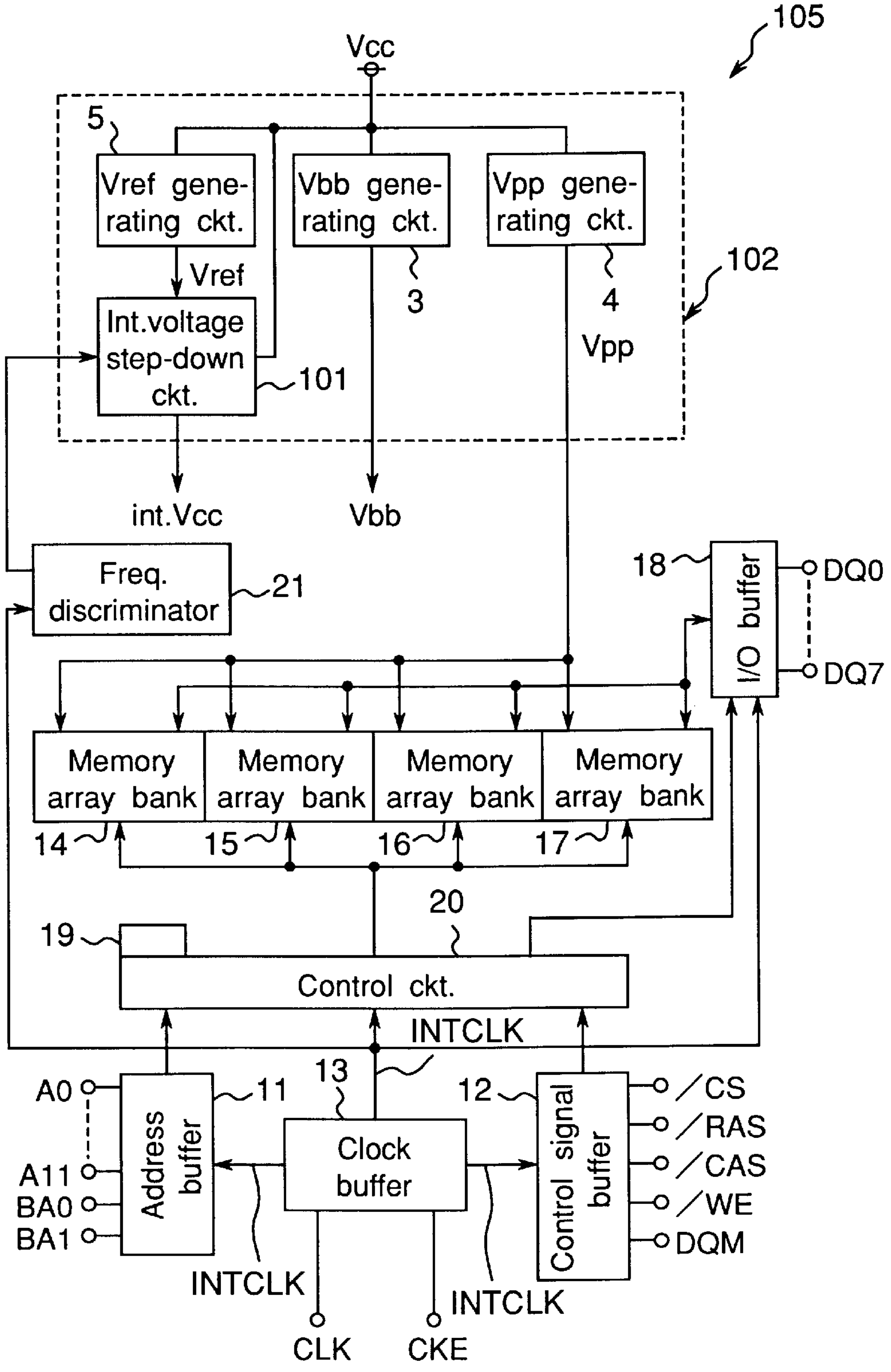
FIG. 10 is a block diagram of a semiconductor integrated circuit device according to the fourth embodiment of the invention.

FIG. 10 is a block diagram of a semiconductor integrated circuit device according to the fourth embodiment of the invention, which is described below using by way of example only a 64 Mbit×8 synchronous DRAM (SDRAM) device. Note that like parts in FIG. 10 and FIG. 1 are identified by the same reference numbers, and further description thereof is omitted below. Only the differences between the first embodiment above and the fourth embodiment are described below.

As in the previous embodiments, the semiconductor integrated circuit device shown in FIG. 10 differs from that in FIG. 1 in the construction of the internal power supply circuit. More specifically, the circuit design of the internal voltage step-down circuit 101 of the internal power supply circuit 102 of the fourth embodiment has been changed from that of the internal voltage step-down circuit 2 in FIG. 1.

The internal power supply circuit 102 of the SDRAM 105 of this fourth embodiment thus comprises the internal voltage step-down circuit 101, reference voltage generator 5 for generating and outputting a reference voltage Vref, substrate voltage generator 3, and step-up voltage generator 4. It should be noted that the internal voltage step-down circuit 101 is the internal voltage step-down means of the claims.

As shown in FIG. 10, the SDRAM 105 of this fourth embodiment thus comprises the internal power supply circuit 102 described above, an address buffer 11, control signal buffer 12, clock buffer 13, four memory array banks 14–17, an input/output (I/O) buffer 18 for data input/output, frequency detector 21, and a control circuit 20 comprising a mode register 19 and controlling the memory array banks 14–17 and I/O buffer 18.

The internal power supply circuit 102 is connected to the power supply terminal Vcc from which power is supplied from an external source. The reference voltage generator 5 is connected to the internal voltage step-down circuit 101. The internal voltage step-down circuit 101 is connected to the internal circuits of the SDRAM 105, but these various connections are not shown in the figure. The substrate voltage generator 3 is also connected to the semiconductor substrate on which the SDRAM 105 is formed, and these connections are also not shown. The frequency detector 21 is also connected to the internal voltage step-down circuit 101.

The internal voltage step-down circuit 101 steps down the power supply voltage input from an external source through the power supply terminal Vcc to generate the internal power supply voltage int.Vcc, and supplies the internal power supply voltage int.Vcc to the internal circuits of the SDRAM 105. Note that the internal power supply voltage int.Vcc is determined based on the reference voltage Vref input from the reference voltage generator 5. More specifically, the internal voltage step-down circuit 101 controls and outputs the internal power supply voltage int.Vcc at the level of the reference voltage Vref supplied from the reference voltage generator 5. The current supply capacity of the internal voltage step-down circuit 101 is switched according to the frequency of the internal clock signal INTCLK output from the frequency detector 21.

Figure 11:
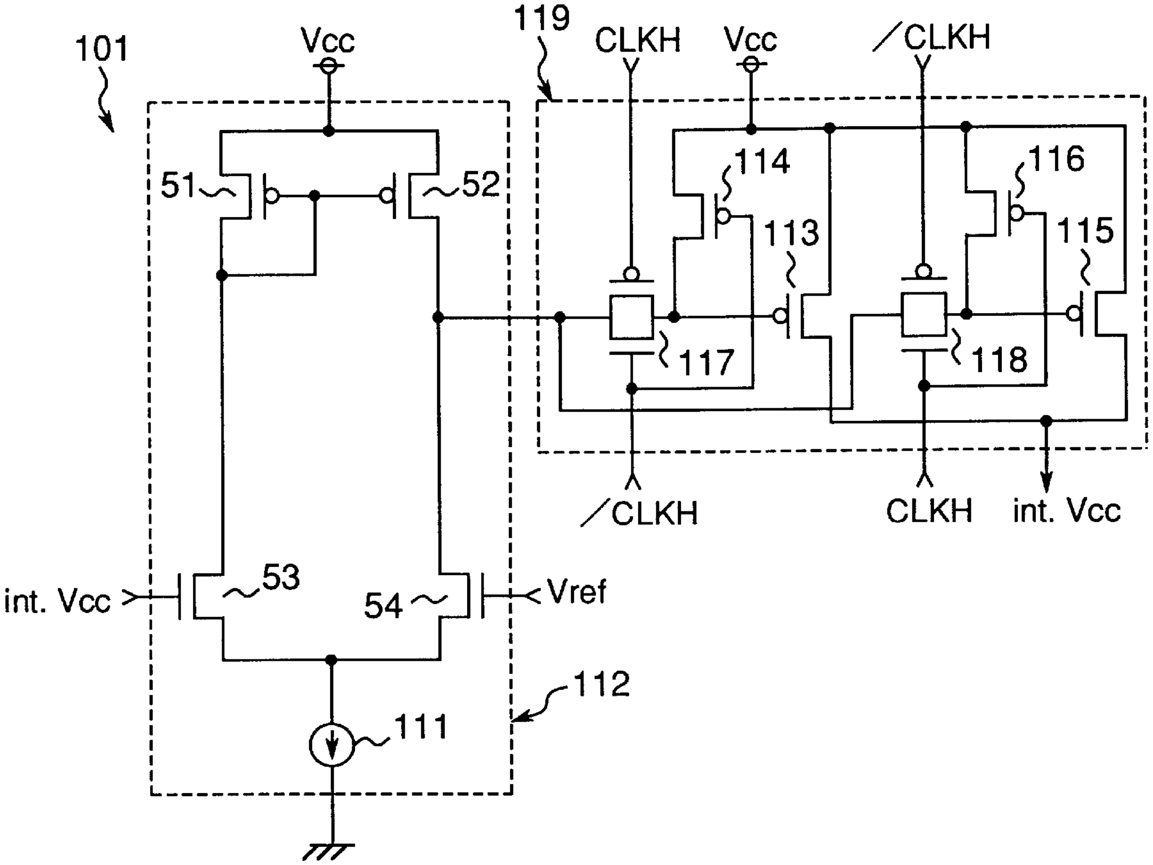
FIG. 11 is a circuit diagram of the internal voltage step-down circuit 101 shown in FIG. 10.

FIG. 11 is a circuit diagram of the internal voltage step-down circuit 101. Note that like parts in FIG. 11 and FIG. 4 are identified by the same reference numbers, and further description thereof is omitted below where only the differences are explained.

The internal voltage step-down circuit 91 shown in FIG. 11 differs from that in FIG. 4 in that the gain control circuit 58 shown in FIG. 4 is eliminated; the differential amplifier 112 includes a constant current supply 111 added to the differential amplifier 55 in FIG. 4; and the output circuit 119 comprises in place of the p-channel MOS transistor 59 shown in FIG. 4 four p-channel MOS transistors 113 to 114, and two transmission gates 117 and 118.

It should be noted that the differential amplifier 112 constitutes the differential amplifier circuit of the claims, and the output circuit 119 constitutes the output circuit of the claims.

As shown in FIG. 11, the internal voltage step-down circuit 101 thus comprises differential amplifier 112 and output circuit 119.

The differential amplifier 112 comprises two p-channel MOS transistors 51 and 52, two n-channel MOS transistors 53 and 54, and the constant current supply 111. The constant current supply 111 is inserted between the ground and the common source connection of the n-channel MOS transistors 53 and 54.

The output circuit 119 comprises p-channel MOS transistors 113 to 116, and transmission gates 117 and 118.

The input to transmission gate 117 is connected to the drain of p-channel MOS transistor 52 and the drain of n-channel MOS transistor 54, and the output is connected to the gate of p-channel MOS transistor 113 and the drain of p-channel MOS transistor 1140 The sources of p-channel MOS transistors 113 and 114 are connected to the power supply terminal Vcc.

The gate of the n-channel MOS transistor of the transmission gate 117, and the gate of p-channel MOS transistor 114, are connected to the inverted output signal /CLKH from the from the n-channel MOS transistor 43 of the frequency detector 21. The gate of the p-channel MOS transistor of the transmission gate 117 is connected to the non-inverted output signal CLKH output from the latch circuit 45 of the frequency detector 21.

The input to transmission gate 118 is connected to the drain of p-channel MOS transistor 52 and the drain of n-channel MOS transistor 54, and the output is connected to the gate of p-channel MOS transistor 115 and the drain of p-channel MOS transistor 116. The sources of p-channel MOS transistors 115 and 116 are connected to the power supply terminal Vcc.

The gate of the n-channel MOS transistor of the transmission gate 118, and the gate of p-channel MOS transistor 116, are connected to the non-inverted output signal CLKH output from the latch circuit 45 of the frequency detector 21. The gate of the p-channel MOS transistor of the transmission gate 118 is connected to the inverted output signal /CLKH from the from the n-channel MOS transistor 43 of the frequency detector 21. The drain of the p-channel MOS transistor 113 is also connected to the drain of the p-channel MOS transistor 115, and this common connection functions as the output of the internal voltage step-down circuit 101.

It should be noted that in this configuration the p-channel MOS transistors 113 and 115 forming the output circuit 119 have gates of different sizes such that more current can flow through p-channel MOS transistor 115 than p-channel MOS transistor 113. In other words, the gate of p-channel MOS transistor 113 is either narrower or longer than the gate of p-channel MOS transistor 115.

As a result, when the frequency of the internal clock signal INTCLK is less than or equal to a particular level, the non-inverted output signal CLKH from frequency detector 21 is LOW and the inverted output signal /CLKH from frequency detector 21 is HIGH; transmission gate 117 is therefore on and conducting, and transmission gate 118 is off and non-conducting. In addition, p-channel MOS transistor 114 is off, p-channel MOS transistor 116 is on. The gate of p-channel MOS transistor 115 is HIGH and p-channel MOS transistor 115 is therefore off and non-conducting. Drain current id113 flows to p-channel MOS transistor 113, and output current id113 from the p-channel MOS transistor 113 is supplied as the output from the internal voltage step-down circuit 101.

When the frequency of the internal clock signal INTCLK exceeds a particular level, the non-inverted output signal CLKH from frequency detector 21 is HIGH and the inverted output signal /CLKH from frequency detector 21 is LOW. Transmission gate 117 is therefore off and non-conducting, and transmission gate 118 is on and conducting. In addition, p-channel MOS transistor 114 is on, and p-channel MOS transistor 116 is off. The gate of p-channel MOS transistor 113 is HIGH and p-channel MOS transistor 113 is therefore off and non-conducting. Drain current id115 flows to p-channel MOS transistor 115, and output current id115 from the p-channel MOS transistor 115 is supplied as the output from the internal voltage step-down circuit 101.

Because p-channel MOS transistor 115 is formed to pass more current than p-channel MOS transistor 113, id115>id113. More specifically, the current flowing from output circuit 119 is greater when p-channel MOS transistor 115 is on than when p-channel MOS transistor 113 is on. The internal voltage step-down circuit 101 can therefore supply more current when the frequency of the internal clock signal INTCLK exceeds a particular level than when it is less than or equal to a particular level.

The semiconductor integrated circuit device according to the fourth embodiment of the invention can thus change the current supply output from the internal voltage step-down circuit 101 according to the frequency of the internal clock signal INTCLK. More specifically, it is possible to reduce the current supply output from the internal voltage step-down circuit 101 when the frequency of the internal clock signal INTCLK is less than or equal to a particular level, and to increase the current supply capacity of the internal voltage step-down circuit 101 when the frequency of the internal clock signal INTCLK exceeds a particular level.

It is therefore possible to prevent the drop in the internal power supply voltage int.Vcc that occurs when the frequency of the internal clock signal INTCLK is high, reduce the current supply output from the internal voltage step-down circuit 101 when the frequency of the internal clock signal INTCLK is low, and thereby reduce current consumption by the SDRAM 105.

Embodiment 5

In the first through fourth embodiments described above the output of the internal voltage step-down circuit is controlled according to the frequency of the internal clock signal INTCLK to prevent a drop in the internal power supply voltage int.Vcc. It is also possible, however, to control the output of the substrate voltage generator according to the frequency of the internal clock signal INTCLK as described below according to the fifth embodiment of the invention.

Figure 12:
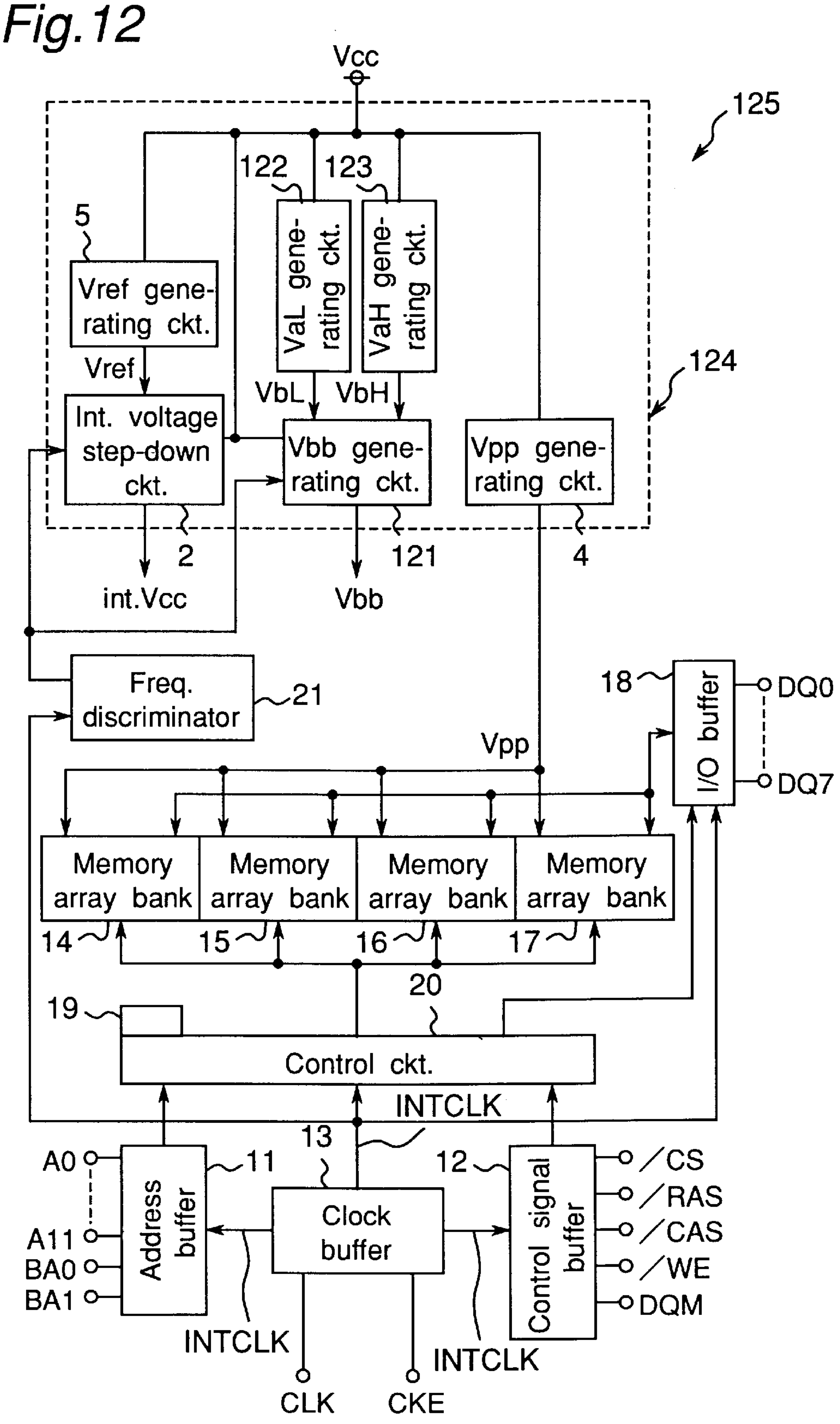
FIG. 12 is a block diagram of a semiconductor integrated circuit device according to the fifth embodiment of the invention.

FIG. 12 is a block diagram of a semiconductor integrated circuit device according to the fifth embodiment of the invention, which is described below using by way of example only a 64 Mbit×8 synchronous DRAM (SDRAM) device. Note that like parts in FIG. 12 and FIG. 1 are identified by the same reference numbers, and further description thereof is omitted below. Only the differences between the first embodiment above and the fifth embodiment are described below.

The semiconductor integrated circuit device shown in FIG. 12 differs from that in FIG. 1 in the construction of the internal power supply circuit 124. More specifically, the circuit design of the substrate voltage generator 121 has been changed from that of the substrate voltage generator 3 in FIG. 1, and a first voltage generator 122 and second voltage generator 123 are added to the internal power supply circuit 10 shown in FIG. 1.

The internal power supply circuit 124 of the SDRAM 125 of this fifth embodiment thus comprises an internal voltage step-down circuit 2, substrate voltage generator 121, step-up voltage generator 4, reference voltage generator 5, first voltage generator 122 for generating and outputting a particular voltage VbL, and second voltage generator 123 for generating and outputting a particular voltage VbH.

The SDRAM 125 of the fifth embodiment shown in FIG. 12 thus comprises the internal power supply circuit 124 described above, an address buffer 11, control signal buffer 12, clock buffer 13, four memory array banks 14–17, an input/output (I/O) buffer 18 for data input/output, frequency detector 21, and a control circuit 20 comprising a mode register 19 and controlling the memory array banks 14–17 and I/O buffer 18.

The internal power supply circuit 124 is connected to the power supply terminal Vcc from which power is supplied from an external source to the reference voltage generator 5. The reference voltage generator 5 is connected to the internal voltage step-down circuit 2, and the internal voltage step-down circuit 2 is connected to the internal circuits of the SDRAM 125, but these various connections are not shown in the figure. The first voltage generator 122 and second voltage generator 123 are separately connected to the substrate voltage generator 121. The substrate voltage generator 121 is connected to the semiconductor substrate on which the SDRAM 125 is formed, and these connections are also not shown in the figures. The frequency detector 21 is also connected to the internal voltage step-down circuit 2 and substrate voltage generator 121.

The internal voltage step-down circuit 2 steps down the power supply voltage input from an external source through the power supply terminal Vcc to generate the internal power supply voltage int.Vcc, and supplies the internal power supply voltage int.Vcc to the internal circuits of the SDRAM 125.

The substrate voltage generator 121 produces and outputs the semiconductor substrate bias voltage, and applies a negative substrate voltage Vbb to the semiconductor substrate.

Figure 13:
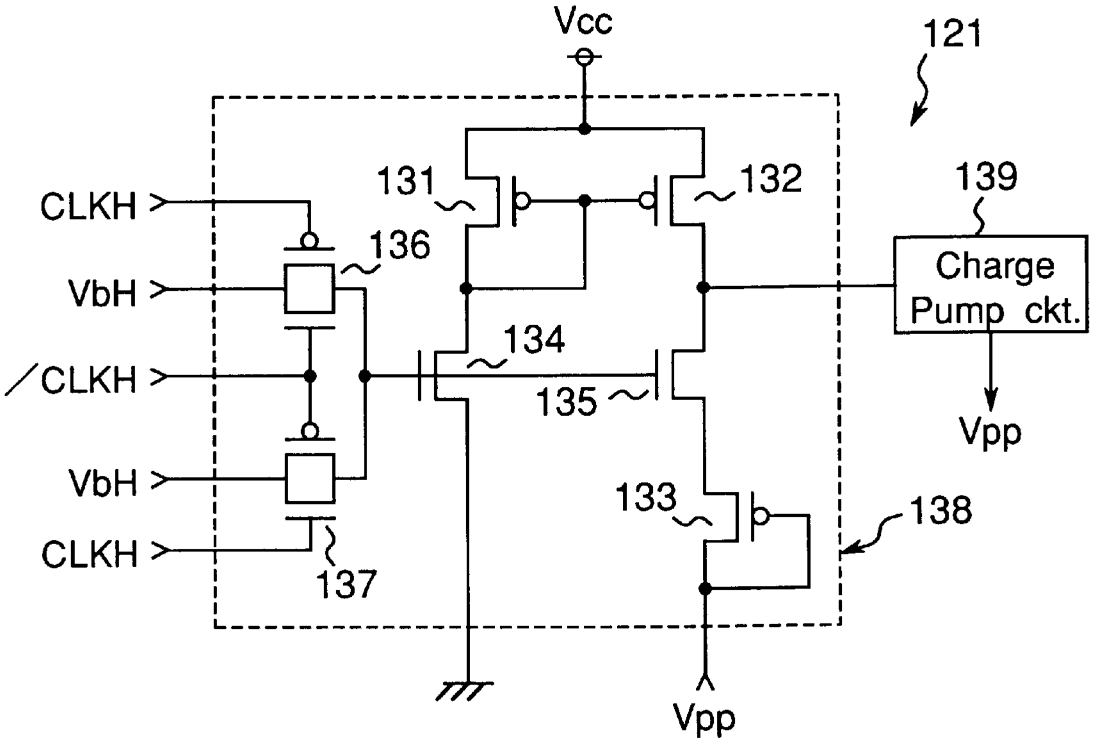
FIG. 13 is a circuit diagram of the substrate voltage generator 121 shown in FIG. 12.

FIG. 13 is a circuit diagram of the substrate voltage generator 121.

As shown in FIG. 13, the substrate voltage generator 121 comprises a substrate voltage detector 138 and a charge pump 139. The substrate voltage detector 138 comprises three p-channel MOS transistor 131, 132, and 133; two n-channel MOS transistors 134 and 135; and two transmission gates 136 and 137.

Note that the substrate voltage detector 138 constitutes the substrate voltage detecting means of the claims, and the charge pump 139 constitutes the charge pump circuit of the claims.

The common connection between the gates of p-channel MOS transistors 131 and 132 in the substrate voltage detector 138 is connected to the drain of the p-channel MOS transistor 131. The power supply terminal Vcc is connected to the source of both p-channel MOS transistors 131 and 132. The drain of the p-channel MOS transistor 131 is connected to the drain of the n-channel MOS transistor 134.

The drains of p-channel MOS transistors 132 and 135 are connected together, and this connection line is tapped as the output of the substrate voltage detector 138 to the input of the charge pump 139.

The output of the charge pump 139 is the output of the substrate voltage generator 121 from whence the substrate voltage Vbb is applied to the semiconductor substrate.

The source of n-channel MOS transistor 134 is grounded, and the source of n-channel MOS transistor 135 is connected to the source of p-channel MOS transistor 133. The gate of p-channel MOS transistor 133 is connected to the drain of p-channel MOS transistor 133, and the substrate voltage Vbb is input to this drain-gate connection. The gate of n-channel MOS transistor 134 is connected to the gate of n-channel MOS transistor 135, and this gate-gate connection is connected to the outputs of transmission gates 136 and 137.

The input of transmission gate 136 is connected to the first voltage generator 122, and the input of transmission gate 137 is connected to the second voltage generator 123. The non-inverted output signal CLKH from the latch circuit 45 of the frequency detector 21 is connected to the gate of the p-channel MOS transistor of transmission gate 136 and to the gate of the n-channel MOS transistor of transmission gate 137. The inverted output signal /CLKH from the from the n-channel MOS transistor 43 of the frequency detector 21 is connected to the gate of the n-channel MOS transistor of transmission gate 136 and to the gate of the p-channel MOS transistor of transmission gate 137.

Thus comprised, the particular voltage VbL output from the first voltage generator 122 is input to the input of transmission gate 136, and the particular voltage VbH output from the second voltage generator 123 is input to the input of transmission gate 137. Note that VbH>VbL.

When frequency of the internal clock signal INTCLK is less than or equal to a particular level, the non-inverted output signal CLKH is LOW and the inverted output signal /CLKH is HIGH. As a result, transmission gate 136 is on and conducting, and transmission gate 137 is off and non-conducting. As a result, the particular voltage VbL is input to the gates of n-channel MOS transistors 134 and 135.

When the frequency of the internal clock signal INTCLK exceeds a particular level, the non-inverted output signal CLKH is HIGH and the inverted output signal /CLKH is LOW. In this case transmission gate 136 is off and non-conducting, and transmission gate 137 is on and conducting. As a result, the particular voltage VbH is input to the gates of n-channel MOS transistors 134 and 135.

n-channel MOS transistors 134 and 135 form the current supply of the substrate voltage detector 138. Note that VbH>VbL. As a result, the voltage input to the gates of n-channel MOS transistors 134 and 135 is greater when the frequency of the internal clock signal INTCLK exceeds a particular level than when it is less than or equal to a particular level. In other words, the current flowing to n-channel MOS transistors 134 and 135 increases, the gate voltage of p-channel MOS transistors 131 and 132 drops, and the drain current of p-channel MOS transistor 132 rises.

When the substrate voltage Vbb rises, p-channel MOS transistor 133 turns off and is non-conducting. The output of the substrate voltage detector 138 thus changes from LOW to HIGH, and the input to the charge pump 139 thus changes from LOW to HIGH. The LOW-to-HIGH transition time of the substrate voltage detector 138 output decreases as the current flow from the p-channel MOS transistor 132 increases.

More specifically, the change from LOW to HIGH in the output of the substrate voltage detector 138 after the p-channel MOS transistor 133 switches off and is non-conducting due to a rise in the substrate voltage Vbb is faster when the frequency of the internal clock signal INTCLK exceeds a particular level than when it is less than or equal to a particular level, and the response of the substrate voltage detector 138 thus improves.

When the substrate voltage Vbb rises and the output of the substrate voltage detector 138 changes from LOW to HIGH, the charge pump 139 lowers the substrate voltage Vbb. When the substrate voltage Vbb drops, the p-channel MOS transistor 133 switches on, the output of the substrate voltage detector 138 turns LOW, and operation stops.

It should be noted that the fifth embodiment described above is achieved by modifying the substrate voltage generator 3 of the first embodiment to change the response of the substrate voltage detector according to the frequency of the internal clock signal INTCLK, but the invention shall not be so limited More specifically, the substrate voltage generator 3 used in the second, third, and fourth embodiments above can be replaced by the substrate voltage generator 121 of the fifth embodiment, and the first voltage generator 122 and second voltage generator 123 can be further added. It is also possible to add the above substrate voltage generator 121, first voltage generator 122, and second voltage generator 123 to a conventional internal power supply circuit comprising an internal voltage step-down circuit.

As described above, the semiconductor integrated circuit device according to the fifth embodiment of the present invention changes the response of the substrate voltage detector 138 in the substrate voltage generator 121 according to the frequency of the internal clock signal INTCLK. More specifically, the response of the substrate voltage detector 138 in the substrate voltage generator 121 is better when the frequency of the internal clock signal INTCLK exceeds a particular level than when it is less than or equal to a particular level. As a result, the substrate voltage generator 121 can detect a rise in the substrate voltage Vbb in a short time when the frequency of the internal clock signal INTCLK exceeds a particular level, thereby rapidly lower the substrate voltage Vbb, and thus prevent the rise in the substrate voltage Vbb that tends to occur when the frequency of the internal clock signal INTCLK is high.

Current consumption by the substrate voltage detector 138 can also be reduced when the frequency of the internal clock signal INTCLK is low, and current consumption by the SDRAM 125 can therefore be reduced.

Embodiment 6

In the first through fourth embodiments described above the output of the internal voltage step-down circuit is controlled according to the internal clock signal frequency to prevent a drop in the internal power supply voltage int.Vcc. In the fifth embodiment the output of the substrate voltage generator is controlled according to the internal clock signal frequency. It-also possible, however, to control the output of the step-up voltage generator according to the internal clock signal frequency as described below according to the sixth embodiment of the invention.

Figure 14:
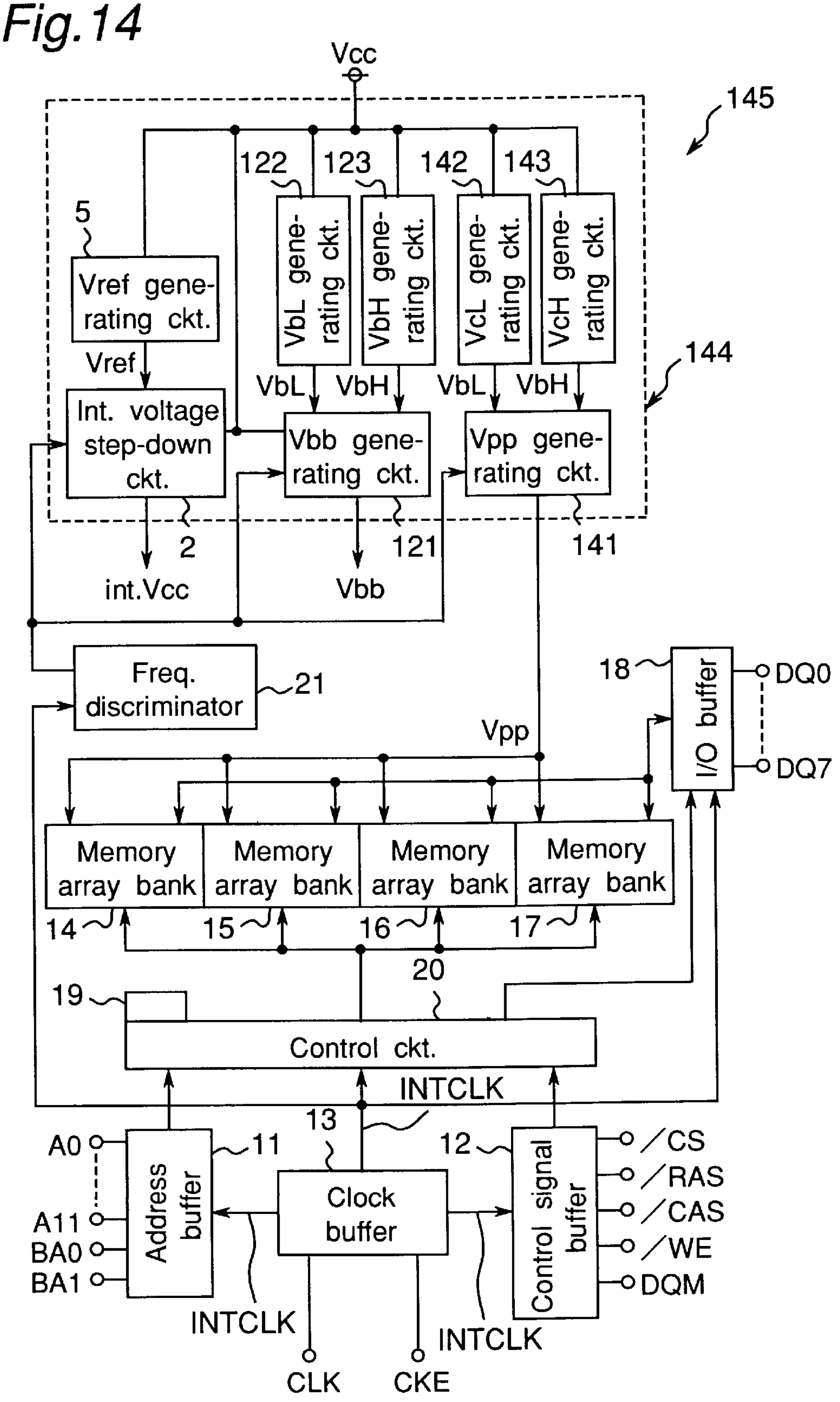
FIG. 14 is a block diagram of a semiconductor integrated circuit device according to the sixth embodiment of the invention.

FIG. 14 is a block diagram of a semiconductor integrated circuit device according to the sixth embodiment of the invention, which is described below using by way of example only a 64 Mbit×8 synchronous DRAM (SDRAM) device. Note that like parts in FIG. 14 and FIG. 12 are identified by the same reference numbers, and further description thereof is omitted below. Only the differences between the fifth embodiment above and the sixth embodiment are described below.

The semiconductor integrated circuit device shown in FIG. 14 differs from that in FIG. 12 in the construction of the internal power supply circuit 144. More specifically, the circuit design of the step-up voltage generator 141 has been changed from that of the step-up voltage generator 4 in FIG. 12, and a third voltage generator 142 and fourth voltage generator 143 are added to the internal power supply circuit 124 shown in FIG. 12.

The internal power supply circuit 144 of the SDRAM 145 of this sixth embodiment thus comprises an internal voltage step-down circuit 2, substrate voltage generator 121, step-up voltage generator 141, reference voltage generator 5, first voltage generator 122, second voltage generator 123, third voltage generator 142 for generating and outputting a particular voltage VcL, and fourth voltage generator 143 for generating and outputting a particular voltage VcH.

Note that the step-up voltage generator 141, third voltage generator 142, and fourth voltage generator 143 constitute the step-up voltage generating means of the claims.

The SDRAM 145 of the sixth embodiment shown in FIG. 14 thus comprises the internal power supply circuit 144 described above, an address buffer 11, control signal buffer 12, clock buffer 13, four memory array banks 14–17, an input/output (I/O) buffer 18 for data input/output, frequency detector 21, and a control circuit 20 comprising a mode register 19 and controlling the memory array banks 14–17 and I/O buffer 18.

The internal power supply circuit 144 is connected to the power supply terminal Vcc from which power is supplied from an external source to the reference voltage generator 5. The reference voltage generator 5 is connected to the internal voltage step-down circuit 2, and the internal voltage step-down circuit 2 is connected to the internal circuits of the SDRAM 145, but these various connections are not shown in the figure. The first voltage generator 122 and second voltage generator 123 are separately connected to the substrate voltage generator 121. The substrate voltage generator 121 is connected to the semiconductor substrate on which the SDRAM 125 is formed, and these connections are also not shown in the figures.

The third voltage generator 142 and fourth voltage generator 143 are connected separately to the step-up voltage generator 141, and the step-up voltage generator 141 is connected to each of the memory array banks 14–17.

The frequency detector 21 is also connected to the internal voltage step-down circuit 2, substrate voltage generator 121, and step-up voltage generator 141.

The internal voltage step-down circuit 2 steps down the power supply voltage input from an external source through the power supply terminal Vcc to generate the internal power supply voltage int.Vcc, and supplies the internal power supply voltage int.Vcc to the internal circuits of the SDRAM 145.

The step-up voltage generator 141 steps up the power supply voltage input from an external source through the power supply terminal Vcc to generate the step-up voltage Vpp. The step-up voltage generator 141 supplies the step-up voltage Vpp to each of the memory array banks 14–17.

Figure 15:
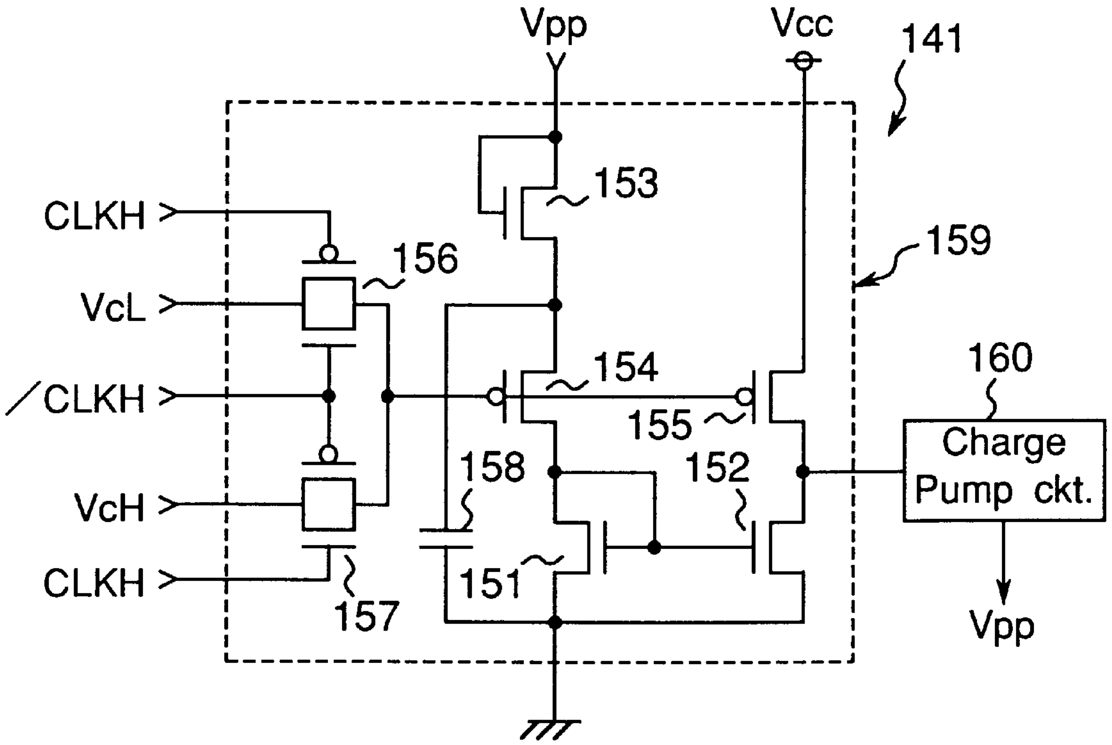
FIG. 15 is a circuit diagram of the step-up voltage generator 141 shown in FIG. 14.
Figure 16:
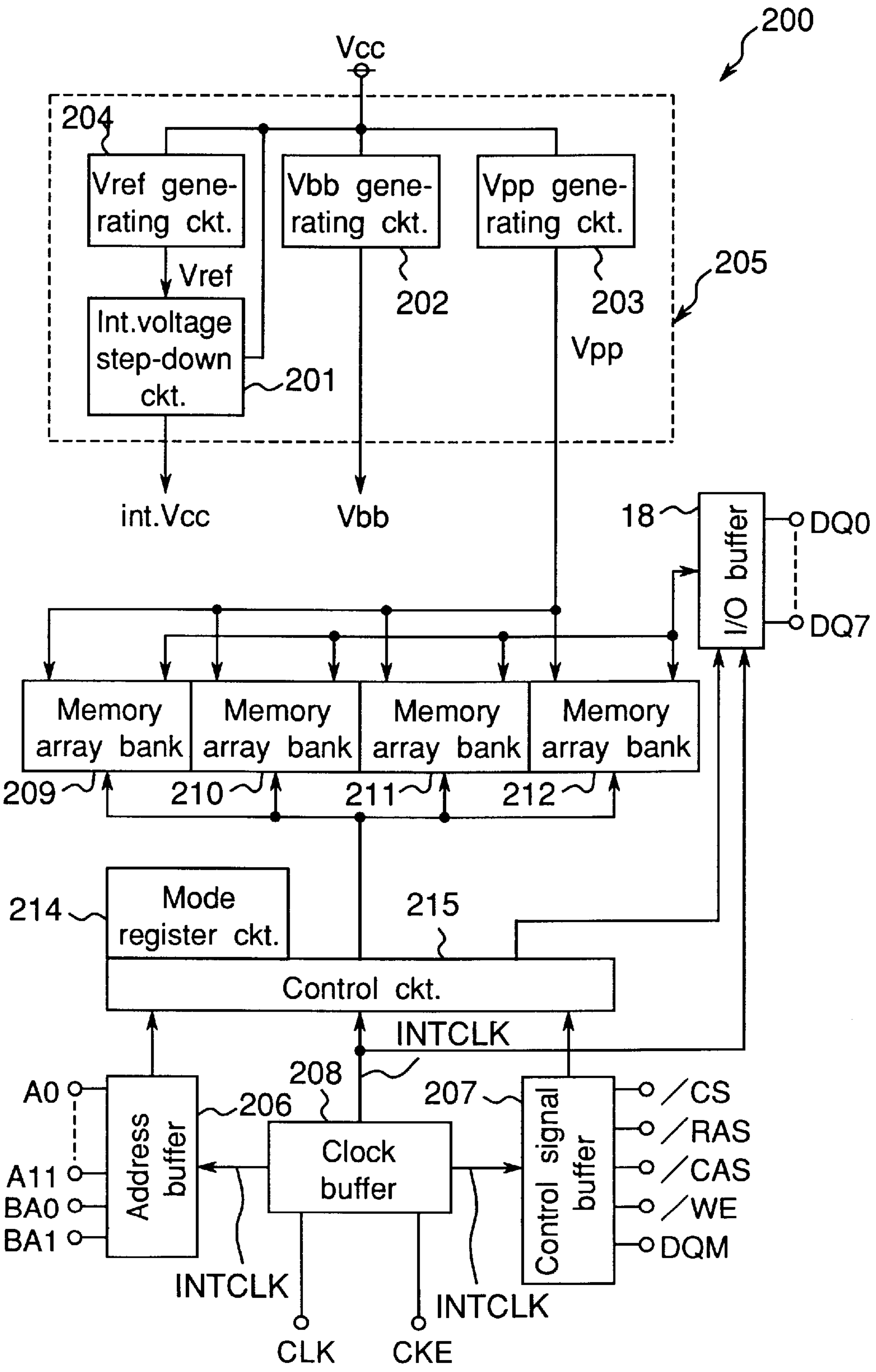
FIG. 16 is a block diagram of a conventional 64 Mbit×8 synchronous DRAM device.

FIG. 15 is a circuit diagram of the step-up voltage generator 141.

As shown in FIG. 15, the step-up voltage generator 141 comprises a step-up voltage detector 159 and a charge pump 160. The step-up voltage detector 159 comprises three n-channel MOS transistors 151, 152, and 153; two p-channel MOS transistors 154 and 155; two transmission gates 156 and 157; and a capacitor 158.

Note that the step-up voltage detector 159 is the step-up voltage detecting means of the claims, and the charge pump 160 is the charge pump circuit of the claims.

In the step-up voltage detector 159 as shown in FIG. 15, the gate of n-channel MOS transistor 151 is connected to the gate of n-channel MOS transistor 152, and this connection line is connected to the drain of n-channel MOS transistor 151. The ground is connected to the source of both n-channel MOS transistor 151 and 152. The drain of n-channel MOS transistor 151 is connected to the drain of p-channel MOS transistor 154.

The drain of n-channel MOS transistor 152 is connected to the drain of p-channel MOS transistor 155, and this connection line is tapped as the output of the step-up voltage detector 159 connected to the input of charge pump 160.

The output of the charge pump 160 is the output of the step-up voltage generator 141 from whence the step-up voltage Vpp is output.

The source of p-channel MOS transistor 154 is connected to the source of n-channel MOS transistor 153, and capacitor 158 is inserted between this source-source connection and the ground. The source of p-channel MOS transistor 155 is connected to the power supply terminal Vcc. The gate of n-channel MOS transistor 153 is connected to the drain of n-channel MOS transistor 153, and the step-up voltage Vpp is applied to this gate-drain connection. The gate of p-channel MOS transistor 155 is connected to the gate of p-channel MOS transistor 154, and this gate-gate connection is connected to the outputs of transmission gates 156 and 157.

The input of transmission gate 156 is connected to the third voltage generator 142, and the input of transmission gate 157 is connected to the fourth voltage generator 143. The non-inverted output signal CLKH output from the latch circuit 45 of the frequency detector 21 is connected to the gate of the p-channel MOS transistor of transmission gate 156, and to the gate of the n-channel MOS transistor of transmission gate 157. The inverted output signal /CLKH from the from the n-channel MOS transistor 43 of the frequency detector 21 is connected to the gate of the n-channel MOS transistor of transmission gate 156, and to the gate of the p-channel MOS transistor of transmission gate 157.

Thus comprised, the particular voltage VcL output from the third voltage generator 142 is input to transmission gate 156, and the particular voltage VcH output from the fourth voltage generator 143 is input to transmission gate 157. Note that VcL>VcH.

When the frequency of the internal clock signal INTCLK is less than or equal to a particular level, the non-inverted output signal CLKH is LOW and the inverted output signal /CLKH is HIGH. As a result, transmission gate 156 is on and conducting, and transmission gate 157 is off and non-conducting. As a result, the particular voltage VcL is input to the gates of p-channel MOS transistors 154 and 155.

When the frequency of the internal clock signal INTCLK exceeds a particular level, the non-inverted output signal CLKH is HIGH and the inverted output signal /CLKH is LOW. In this case transmission gate 156 is off and non-conducting, and transmission gate 157 is on and conducting. As a result, the particular voltage VcH is input to the gates of p-channel MOS transistors 154 and 155.

Because VcL>VcH as described above, the voltage input to the gates of p-channel MOS transistors 154 and 155 is higher when the frequency of the internal clock signal INTCLK exceeds a particular level than when it is less than or equal to a particular level. In other words, when the current flowing to p-channel MOS transistors 154 and 155 increases and n-channel MOS transistor 153 is on, the gate voltage of n-channel MOS transistors 151 and 152 increases, and the drain current of p-channel MOS transistor 155 increases.

When the step-up voltage Vpp rises the n-channel MOS transistor 153 turns off and is non-conducting. The output of the step-up voltage detector 159 thus changes from LOW to HIGH, and the input to the charge pump 160 thus also goes HIGH from LOW. The LOW-to-HIGH transition time of the step-up voltage detector 159 output decreases as the current flow from the p-channel MOS transistor 155 increases.

More specifically, the change from LOW to HIGH in the output of the step-up voltage detector 159 after the n-channel MOS transistor 153 switches off and is non-conducting due to a drop in the step-up voltage Vpp is faster when the frequency of the internal clock signal INTCLK exceeds a particular level than when it is less than or equal to a particular level, and the response of the step-up voltage detector 159 thus improves.

When the step-up voltage Vpp drops and the step-up voltage detector 159 output goes HIGH from LOW, the charge pump 160 boosts the step-up voltage Vpp. When the step-up voltage Vpp rises, n-channel MOS transistor 153 switches on, the output of step-up voltage detector 159 goes LOW, and operation stops.

It should be noted that the sixth embodiment described above is achieved by modifying the step-up voltage generator 4 of the fifth embodiment to change the response of the step-up voltage detector according to the frequency of the internal clock signal INTCLK, but the invention shall not be so limited. More specifically, the step-up voltage generator 141, third voltage generator 142, and fourth voltage generator 143 described above can also be used in place of the step-up voltage generator 4 in the first through fourth embodiments described above. It is also possible to add the step-up voltage generator 141, third voltage generator 142, and fourth voltage generator 143 described above to a conventional internal power supply circuit comprising-an internal voltage step-down circuit and substrate voltage generator.

As described above, the semiconductor integrated circuit device according to the sixth embodiment of the present invention changes the response of the step-up voltage detector 159 of the step-up voltage generator 141 according to the frequency of the internal clock signal INTCLK. More specifically, the response of the step-up voltage detector 159 in the step-up voltage generator 141 is better when the frequency of the internal clock signal INTCLK exceeds a particular level than when it is less than or equal to a particular level. As a result, the step-up voltage generator 141 can detect a drop in the step-up voltage Vpp in a short time when the frequency of the internal clock signal INTCLK exceeds a particular level, thereby rapidly increase the step-up voltage Vpp, and thus prevent the drop in the step-up voltage Vpp that tends to occur when the frequency of the internal clock signal INTCLK is high.

Current consumption by the step-up voltage detector 159 can also be reduced when the internal clock signal INTCLK is high, and current consumption by the SDRAM 155 can therefore be reduced.

In the semiconductor integrated circuit device according to the first embodiment of the invention a frequency discriminator detects the frequency of the internal clock signal INTCLK. The speed at which the output current is increased in response to a drop in the internal power supply voltage therefore increases as the internal clock signal frequency increases. It is therefore possible to quickly increase the current supply in response to a drop in the internal power supply voltage when the internal clock signal frequency is high, and the drop in the internal power supply voltage that occurs when the internal clock signal frequency is high can be prevented.

The internal voltage step-down means of the semiconductor integrated circuit device according to the first embodiment of the invention preferably comprises a differential amplifier to which the output internal power supply voltage and a particular reference voltage are input, a gain control means for controlling the current flow to the differential amplifier to control the gain of the differential amplifier, and an output circuit for changing the current supply capacity according to the output voltage of the differential amplifier. In this embodiment the gain control means increases the current flow to the differential amplifier to increase the gain of the differential amplifier as the internal clock signal frequency rises.

Response is improved by thus increasing the gain of the differential amplifier as the internal clock signal frequency rises. It is therefore possible to supply much current in a short time in response to a drop in the internal power supply voltage when the internal clock signal frequency is high, and thereby prevent the drop in the internal power supply voltage that otherwise occurs when the internal clock signal frequency is high.

In a further alternative embodiment of the above semiconductor integrated circuit device according to the invention the gain control means preferably comprises plural MOS transistors of varying gate sizes for supplying current to the differential amplifier, and increases the current flow to the differential amplifier as the internal clock signal frequency rises by operating a MOS transistor with a larger drain current.

The gain control means yet alternatively comprises plural MOS transistors for supplying current to the differential amplifier, and increases the current flow to the differential amplifier as the internal clock signal frequency rises by increasing the number of operating MOS transistors.

In yet another alternative embodiment, the gain control means comprises a MOS transistor for supplying current to the differential amplifier, and a gate voltage control circuit for controlling the gate voltage of the MOS transistor according to the internal clock signal frequency. In this case, the gate voltage control circuit controls the gate voltage of the MOS transistor to increase the current supply to the differential amplifier as the internal clock signal frequency rises.

Response is improved by thus increasing the gain of the differential amplifier as the internal clock signal frequency rises. It is therefore possible to supply much current in a short time in response to a drop in the internal power supply voltage when the internal clock signal frequency is high, and thereby prevent the drop in the internal power supply voltage that otherwise occurs when the internal clock signal frequency is high. Moreover, it is possible to decrease current consumption by the differential amplifier when the internal clock signal frequency is low, and thereby decrease current consumption by the semiconductor integrated circuit device.

In a semiconductor integrated circuit device according to a further embodiment of the invention the internal voltage step-down means selects a higher reference voltage as the internal clock signal frequency increases to compensate for a drop in the internal power supply voltage.

The internal voltage step-down means of the semiconductor integrated circuit device in this case comprises a reference voltage selection means for selecting a reference voltage output from the reference voltage generating means according to the internal clock signal frequency, a differential amplifier to which the output internal power supply voltage and the reference voltage selected by the reference voltage selection means are input, and an output circuit for changing the current supply capacity according to the output voltage of the differential amplifier. The reference voltage selection means selects a higher reference voltage as the internal clock signal frequency rises.

The internal power supply voltage output by the internal voltage step-down means is thus stepped up when the internal clock signal frequency is high, thereby compensating for the drop in the internal power supply voltage that otherwise occurs when the internal clock signal frequency is high. It is thus possible to prevent the drop in the internal power supply voltage that occurs when the internal clock signal frequency is high.

In a semiconductor integrated circuit device according to a further embodiment of the invention the current supply capacity from the internal voltage step-down means is increased when the internal clock signal frequency is high.

The internal voltage step-down means of the semiconductor integrated circuit device in this case preferably comprises a differential amplifier to which the output internal power supply voltage and a particular reference voltage are input, and an output circuit for changing the current supply capacity according to the internal clock signal frequency. In this case, the output circuit increases the output current supply capacity as the internal clock signal frequency rises.

As a result, the current supply capacity of the internal voltage step-down means is small when the internal clock signal frequency is low, and when the internal clock signal frequency is high, the current output from the internal voltage step-down means can be made great. It is therefore possible to prevent the drop in the internal power supply voltage that occurs when the internal clock signal frequency is high, reduce the output current from the internal voltage step-down means when the internal clock signal frequency is low, and thereby provide for reduced current consumption by the semiconductor integrated circuit device.

It is also preferable in the preceding embodiments to further comprise a substrate voltage generating means for generating and outputting a semiconductor substrate bias voltage, and applying a substrate voltage to the semiconductor substrate. As a result, the response of the substrate voltage generating means to an increase in the substrate voltage improves, and the speed at which a rise in the substrate voltage is detected increases, as the frequency determined by the frequency discriminator rises. The substrate voltage generating means can thus quickly detect a rise in the substrate voltage to lower the substrate voltage when the internal clock signal frequency is high, and the substrate voltage rise that also occurs when the internal clock signal frequency is high can be prevented.

It is alternatively preferable in the preceding embodiments to further comprise a step-up voltage generating means for generating and outputting a step-up voltage by boosting the externally supplied power voltage. In this case, the speed at which a drop in the step-up voltage is detected increases, and the response of the step-up voltage generating means to a drop in the step-up voltage improves, as the frequency determined by the frequency discriminator rises. The step-up voltage generating means can thus quickly detect a fall in the step-up voltage and thereby boost the step-up voltage when the internal clock signal frequency is high, and the step-up voltage drop that also occurs when the internal clock signal frequency is high can be prevented.

The semiconductor integrated circuit device according to a further embodiment of the invention improves response to an increase in the substrate voltage, and increases the speed at which a rise in the substrate voltage is detected. The substrate voltage generating means can thus quickly detect a rise in the substrate voltage to lower the substrate voltage when the internal clock signal frequency is high, and the substrate voltage rise that also occurs when the internal clock signal frequency is high can be prevented.

The substrate voltage generating means in this case preferably comprises a charge pump circuit for lowering the substrate voltage, and a substrate voltage detecting means for detecting the output substrate voltage, and operating the charge pump circuit when the substrate voltage exceeds a particular value. In this case the response of the substrate voltage detecting means to an increase in the substrate voltage improves, and the speed at which it is detected that the substrate voltage exceeds a particular value increases, as the internal clock signal frequency rises.

By thus improving the response of the substrate voltage detecting means when the internal clock signal frequency is high, a rise in the substrate voltage when the internal clock signal frequency is high can be quickly detected and the substrate voltage dropped. It is therefore possible to prevent the rise in the substrate voltage that occurs when the internal clock signal frequency is high.

The semiconductor integrated circuit device according to a further embodiment of the invention improves response to a drop in the step-up voltage, and increases the speed at which a drop in the step-up voltage is detected, as the internal clock signal frequency determined by the frequency discriminator rises. A drop in the step-up voltage can therefore be quickly detected and the step-up voltage boosted when the internal clock signal frequency is high, and the step-up voltage drop that also occurs when the internal clock signal frequency is high can be prevented.

The step-up voltage generating means in this case preferably comprises a charge pump circuit for boosting the step-up voltage, and a step-up voltage detecting means for detecting the output step-up voltage, and operating the charge pump circuit when the step-up voltage falls below a particular value. In this case, the response of the step-up voltage detecting means to a drop in the step-up voltage improves, and the speed at which a drop in the step-up voltage is detected increases, as the internal clock signal frequency rises. By thus improving the response of the step-up voltage detecting means when the internal clock signal frequency is high, a drop in the step-up voltage can be quickly detected and the step-up voltage boosted when the internal clock signal frequency is high, and the step-up voltage drop that also occurs when the internal clock signal frequency is high can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device comprising an internal voltage step-down circuit for stepping down a power supply voltage supplied from an external source to generate and output an internal power supply voltage based on a particular reference voltage, an internal clock signal generator for generating an internal clock signal based on a clock signal supplied from an external source, and a frequency discriminator for determining the frequency of the internal clock signal generated by said internal clock signal generator, wherein said internal voltage step-down circuit controls an output voltage thereof in response to the frequency identified by said frequency discriminator to compensate for a drop in the internal power supply voltage caused when the frequency of the internal clock signal rises.

2. The semiconductor integrated circuit device according to claim 1 wherein said internal voltage step-down circuit increases the speed at which the output current rises in response to a drop in the internal power supply voltage as the frequency identified by said frequency discriminator rises.

3. The semiconductor integrated circuit device according to claim 2 wherein said internal voltage step-down circuit comprises a differential amplifier to which the output internal power supply voltage and a particular reference voltage are input, a gain control means for controlling the current flow to said differential amplifier to control the gain of said differential amplifier, and an output circuit for changing the current supply capacity according to the output voltage of said differential amplifier, wherein said gain control means increases the current flow to said differential amplifier and increases the gain of said differential amplifier as the internal clock signal frequency rises.

4. The semiconductor integrated circuit device according to claim 3 wherein said gain control means comprises plural MOS transistors of varying gate sizes for supplying current to said differential amplifier, and increases the current flow to said differential amplifier as the internal clock signal frequency rises by operating a MOS transistor with a larger drain current.

5. The semiconductor integrated circuit device according to claim 3 wherein said gain control means comprises plural MOS transistors for supplying current to said differential amplifier, and increases the current flow to said differential amplifier as the internal clock signal frequency rises by increasing the number of operating MOS transistors.

6. The semiconductor integrated circuit device according to claim 3 wherein said gain control means comprises a MOS transistor for supplying current to said differential amplifier, and a gate voltage control circuit for controlling the gate voltage of said MOS transistor according to the internal clock signal frequency, wherein said gate voltage control circuit controls the gate voltage of said MOS transistor to increase the current supply to said differential amplifier as the internal clock signal frequency rises.

7. The semiconductor integrated circuit device according to claim 1 wherein said internal voltage step-down circuit increases the output current supply capacity as the frequency determined by said frequency discriminator increases.

8. The semiconductor integrated circuit device according to claim 7 wherein said internal voltage step-down circuit comprises a differential amplifier to which the output internal power supply voltage and a particular reference voltage are input, and an output circuit for changing the current supply capacity according to the internal clock signal frequency, wherein the output circuit increases the output current supply capacity as the internal clock signal frequency rises.

9. The semiconductor integrated circuit device according to claim 1 further comprising a substrate voltage generating means for generating and outputting a semiconductor substrate bias voltage, and applying a substrate voltage to said semiconductor substrate, wherein the speed at which a rise in the substrate voltage is detected increases, and the response of the substrate voltage generating means to an increase in the substrate voltage improves, as the frequency determined by the frequency discriminator rises.

10. The semiconductor integrated circuit device according to claim 9 wherein said substrate voltage generating means comprises a charge pump circuit for lowering the substrate voltage, and a substrate voltage detecting means for detecting the output substrate voltage, and operating the charge pump circuit when the substrate voltage exceeds a particular value, wherein the response of the substrate voltage detecting means to an increase in the substrate voltage improves, and the speed at which it is detected that the substrate voltage exceeds a particular value increases, as the internal clock signal frequency rises.

11. The semiconductor integrated circuit device according to claim 1 further comprising a step-up voltage generating means for generating and outputting a step-up voltage by boosting the externally supplied power voltage, wherein the speed at which a drop in the step-up voltage is detected increases, and the response of the step-up voltage generating means to a drop in the step-up voltage improves, as the frequency determined by the frequency discriminator rises.

12. The semiconductor integrated circuit device according to claim 11 wherein said step-up voltage generating means comprises a charge pump circuit for boosting the step-up voltage, and a step-up voltage detecting means for detecting the output step-up voltage, and operating the charge pump circuit when the step-up voltage falls below a particular value, wherein the response of the step-up voltage detecting means to a drop in the step-up voltage improves, and the speed at which a drop in the step-up voltage is detected increases, as the internal clock signal frequency rises.

13. A semiconductor integrated circuit device comprising a reference voltage generating circuit for generating and outputting plural different reference voltages, an internal voltage step-down circuit for selecting a reference voltage input from said reference voltage generating circuit, and stepping down a power supply voltage supplied from an external source to generate an internal power supply voltage based on the selected reference voltage, an internal clock signal generator for generating an internal clock signal based on a clock signal supplied from an external source, and a frequency discriminator for determining the frequency of the internal clock signal generated by said internal clock signal generator, wherein said internal voltage step-down circuit selects a higher reference voltage as the frequency determined by said frequency discriminator increases to compensate for a drop in the internal power supply voltage.

14. The semiconductor integrated circuit device according to claim 13 wherein said internal voltage step-down circuit comprises a reference voltage selection means for selecting a reference voltage output from said reference voltage generating circuit according to the internal clock signal frequency, a differential amplifier to which the output internal power supply voltage and the reference voltage selected by said reference voltage selection means are input, and an output circuit for changing the current supply capacity according to the output voltage of said differential amplifier, wherein said reference voltage selection means selects a higher reference voltage as the internal clock signal frequency rises.

* * * * *